(12) United States Patent
Shigihara et al.

(10) Patent No.: US 7,870,466 B2
(45) Date of Patent: Jan. 11, 2011

(54) PARALLEL CYCLIC CODE GENERATION DEVICE AND PARALLEL CYCLIC CODE ERROR DETECTION DEVICE

(75) Inventors: Masahiro Shigihara, Tokyo (JP); Toru Takamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 312 days.

(21) Appl. No.: 12/198,389

(22) Filed: Aug. 26, 2008

(65) Prior Publication Data

US 2009/0106631 A1  Apr. 23, 2009

(30) Foreign Application Priority Data

Aug. 28, 2007  (JP) ............................. 2007-220948

(51) Int. Cl.
    *H03M 13/00* (2006.01)
(52) U.S. Cl. ....................................... 714/781; 714/757
(58) Field of Classification Search .................. 714/757, 714/781
    See application file for complete search history.

(56) References Cited

U.S. PATENT DOCUMENTS

| 4,937,828 | A | * | 6/1990 | Shih et al. ................... 714/757 |
| 5,375,127 | A | * | 12/1994 | Leak et al. ................... 714/772 |
| 5,778,013 | A | * | 7/1998 | Jedwab ....................... 714/807 |
| 5,898,712 | A | * | 4/1999 | Kodama et al. ............. 714/807 |
| 5,935,269 | A | * | 8/1999 | Kodama et al. ............. 714/781 |
| 6,052,815 | A | * | 4/2000 | Zook .......................... 714/758 |
| 6,134,597 | A | * | 10/2000 | Rieth et al. ................. 709/237 |
| 6,357,032 | B1 | * | 3/2002 | Plotz et al. .................. 714/758 |
| 6,836,869 | B1 | * | 12/2004 | Wyland ....................... 714/781 |
| 7,428,693 | B2 | * | 9/2008 | Obuchi et al. ............... 714/804 |
| 2003/0061561 | A1 | * | 3/2003 | Rifaat et al. ................. 714/774 |
| 2005/0097432 | A1 | * | 5/2005 | Obuchi et al. ............... 714/800 |
| 2006/0146980 | A1 | * | 7/2006 | Sun ............................. 377/69 |

FOREIGN PATENT DOCUMENTS

JP    2002-359561 A    12/2002

OTHER PUBLICATIONS

Ji, Michael H., et al., "Fast Parallel CRC Algorithm and Implementation on a Configurable Processor," 2002, IEEE, pp. 1813-1817, Tensilica, Inc.

* cited by examiner

*Primary Examiner*—M. Mujtaba K Chaudry
(74) *Attorney, Agent, or Firm*—Sughrue Mion, PLLC

(57) ABSTRACT

To eliminate the need for buffering in order to calculate data length information on data as an object of computation, a first exclusive-OR unit 53 executes computation of exclusive-OR of a cyclic code R(x) of the integral multiple bit bits block A(x) and a data string of M bits, containing the fraction bits block B(x). A first shifting unit 54 shifts the exclusive-OR of the cyclic code R(x) and the data string of M bits, containing the fraction bits block B(x), by {M−H(k)} bits toward a least significant side, where M is a parallel width and H(k) is a bit length of the fraction bits block B(x). An R'(x) generation unit 55 generates a cyclic code R'(x) that is a cyclic code of the data after shifting. To obtain R"(x), a second shifting unit 56 shifts the cyclic code R(x) by H(k) bits toward a most significant side. A second exclusive-OR unit 57 executes computation of exclusive-OR of the cyclic code R'(x) and data R"(x).

14 Claims, 19 Drawing Sheets

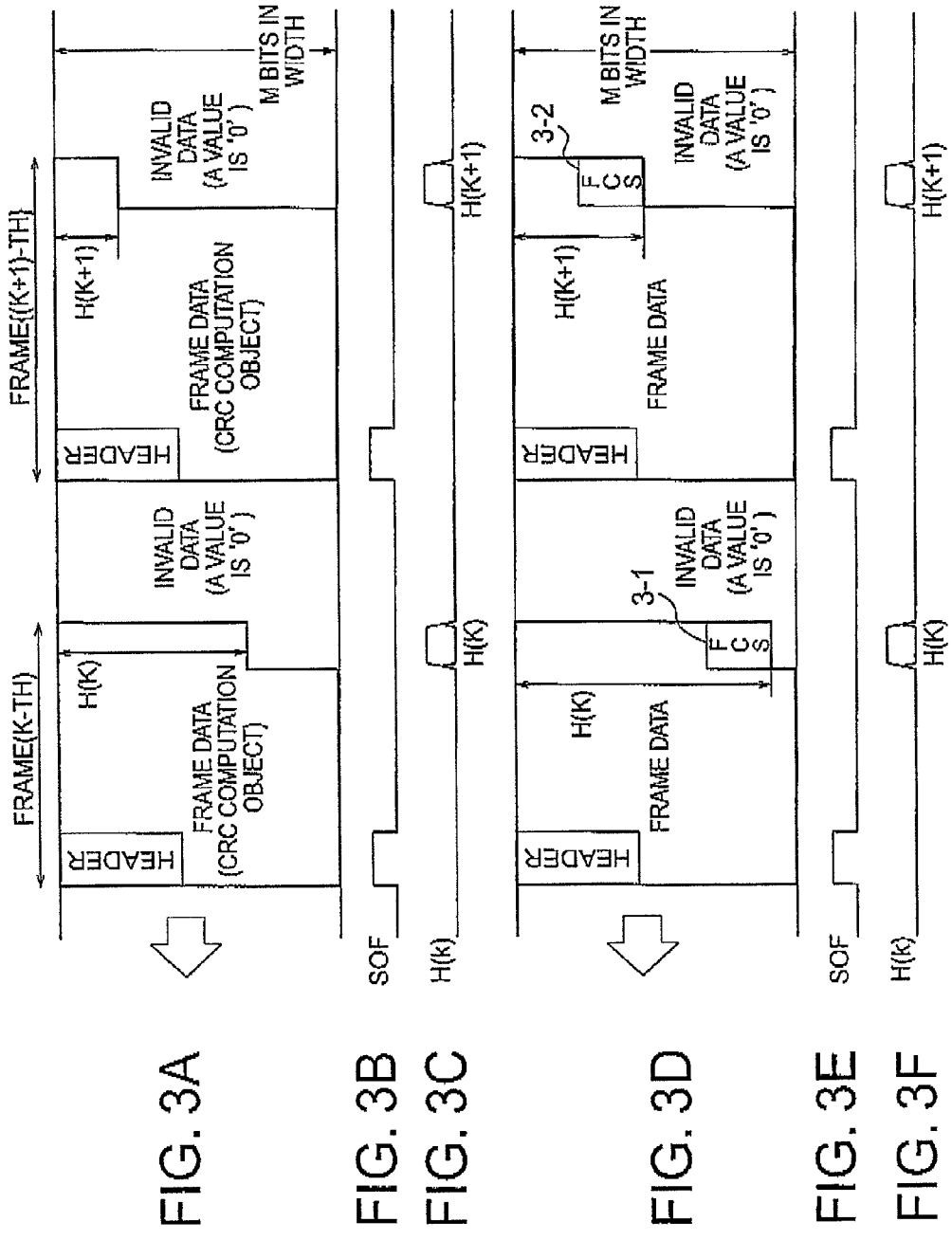

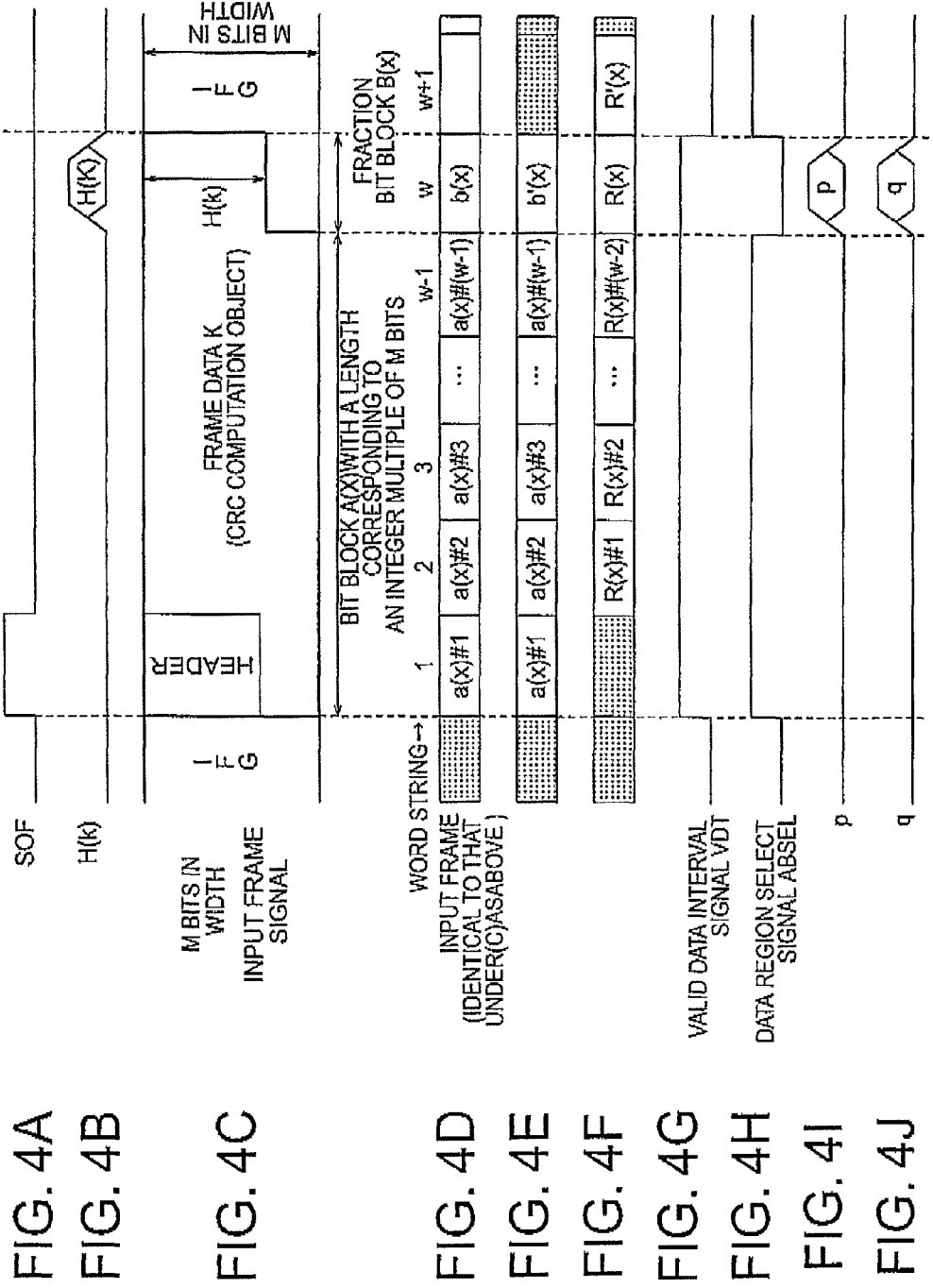

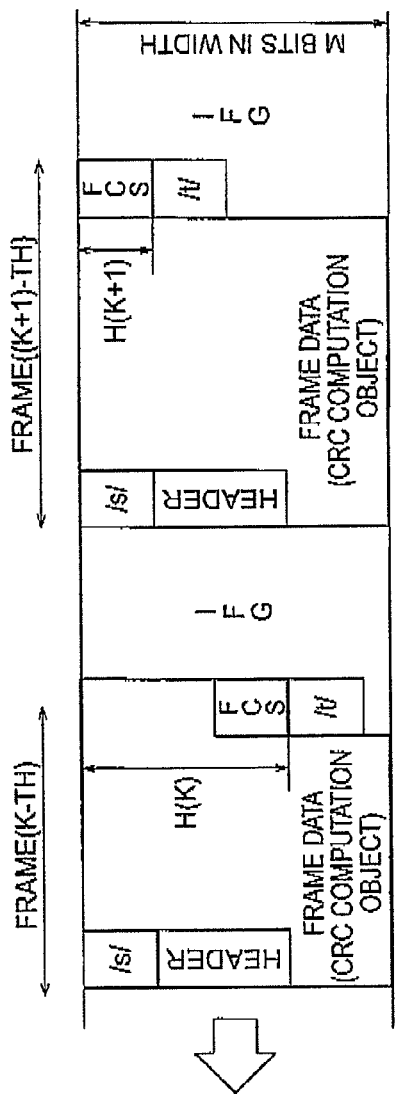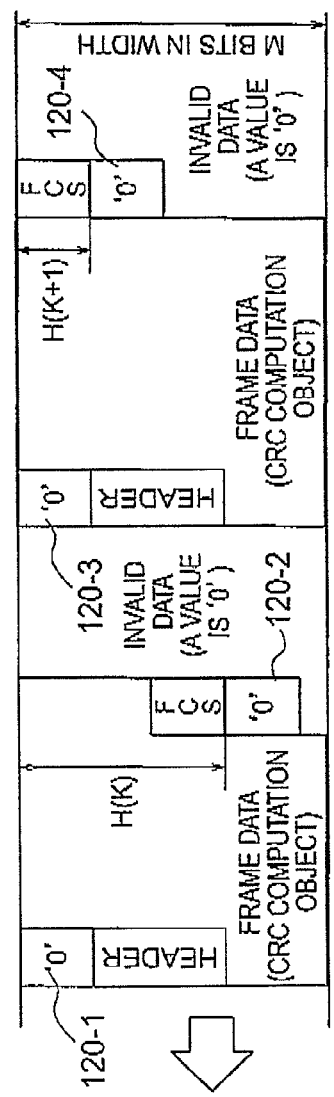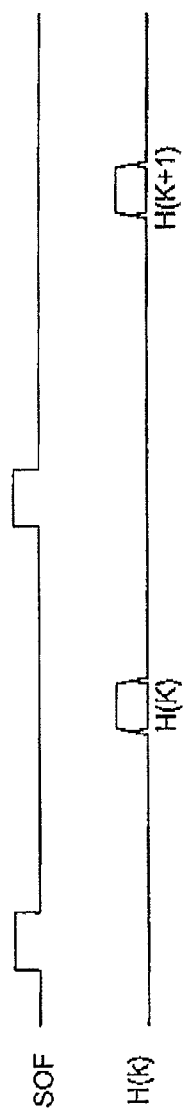
FIG. 12A  FIG. 12B  FIG. 12C  FIG. 12D

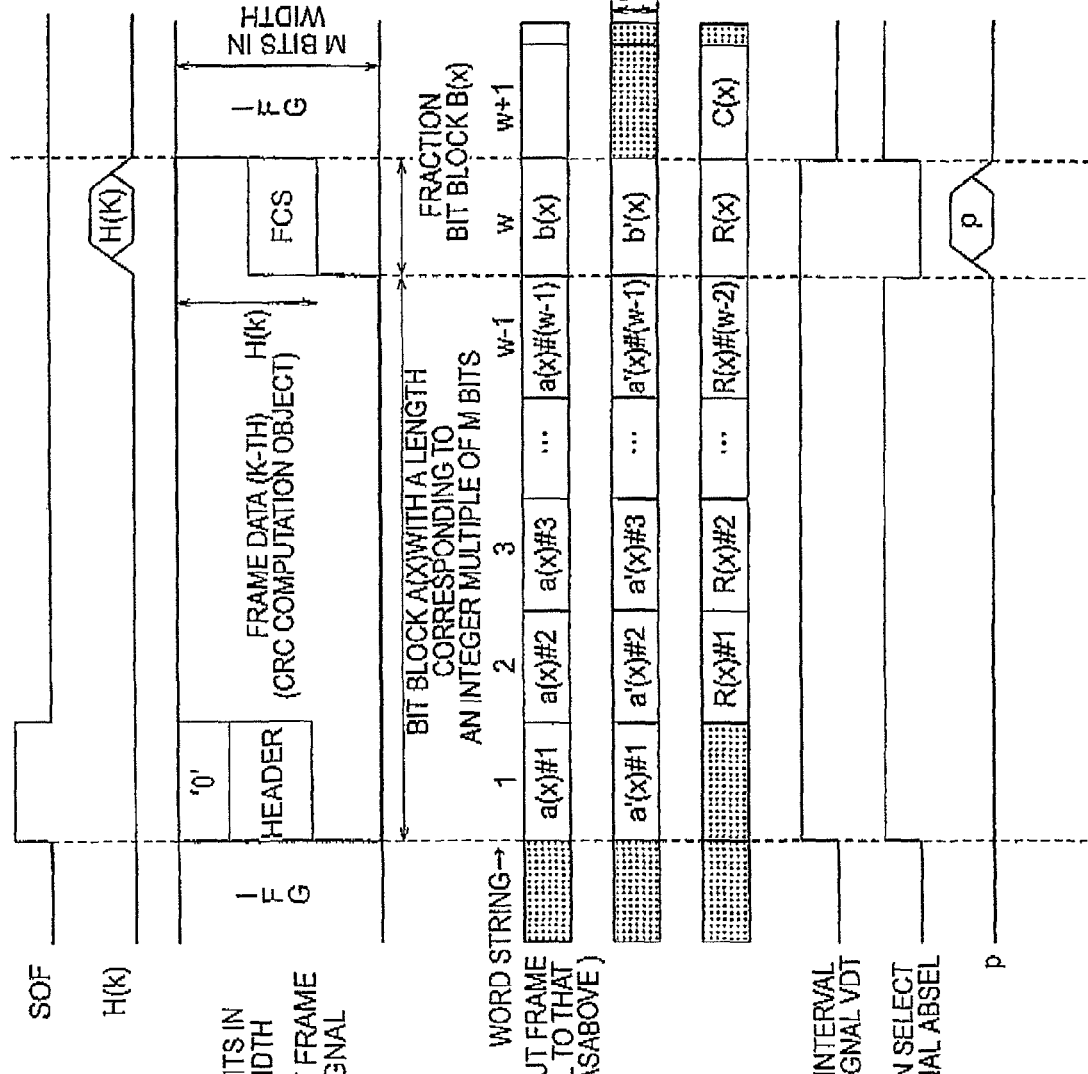

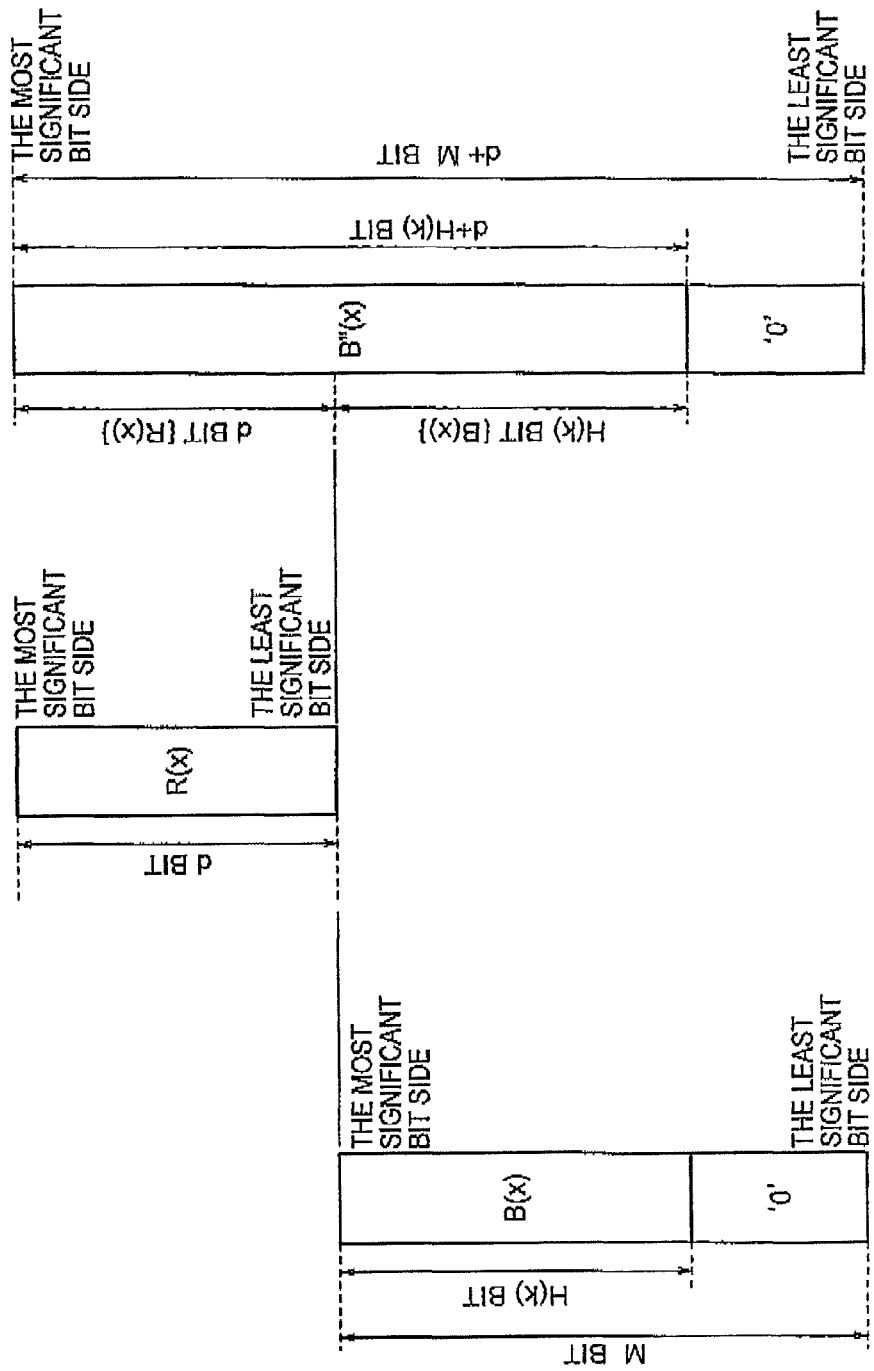

FIG. 19A RELATED ART

| WORD → | 1 | 2 | 3 | 4 |
|---|---|---|---|---|
| | 18-1-1 | 18-2-1 | 18-3-1 | 18-4-1 |
| | 18-1-2 | 18-2-2 | 18-3-2 | 18-4-2 |
| | 18-1-3 | 18-2-3 | 18-3-3 | 18-4-3 |
| | 18-1-4 | 18-2-4 | 18-3-4 | 18-4-4 |
| | 18-1-5 | 18-2-5 | 18-3-5 | 18-4-5 |
| | 18-1-6 | 18-2-6 | 18-3-6 | ■ |
| | 18-1-7 | 18-2-7 | 18-3-7 | ■ |
| | 18-1-8 | 18-2-8 | 18-3-8 | ■ |

INPUT FRAME DATA

FIG. 19B RELATED ART

| WORD → | 1 | 2 | 3 | 4 |
|---|---|---|---|---|
| | ■ | 18-1-6 | 18-2-6 | 18-3-6 |
| | 18-1-1 | 18-1-7 | 18-2-7 | 18-3-7 |
| | 18-1-2 | 18-1-8 | 18-2-8 | 18-3-8 |
| | 18-1-3 | 18-2-1 | 18-3-1 | 18-4-1 |
| | 18-1-4 | 18-2-2 | 18-3-2 | 18-4-2 |
| | 18-1-5 | 18-2-3 | 18-3-3 | 18-4-3 |
| | 18-2-4 | 18-2-4 | 18-3-4 | 18-4-4 |
| | 18-2-5 | 18-2-5 | 18-3-5 | 18-4-5 |

DATA AFTER REARRANGED

X-Y-Z
X:OBJECT DATA
Y:WORD STRING NUMBER
Z:BIT NUMBER

PARALLEL CYCLIC CODE GENERATION DEVICE AND PARALLEL CYCLIC CODE ERROR DETECTION DEVICE

This application is based upon and claims the benefit of priority from Japanese patent application No. 2007-220948, filed on Aug. 28, 2007, the disclosure of which is incorporated herein in its entirety by reference.

BACKGROUND OF THE INVENTION

1. Field of the Invention

The invention relates to a parallel cyclic code generation device for generating a cyclic code for use in detecting a bit error inside transfer frames in data communications, and also relates to a parallel cyclic code error detection device for inspecting a cyclic code for use in detecting a bit error inside transfer frames in data communications.

2. Description of Related Art

In recent years, there have been advances in broader bandwidths for a frame rate in data communications technology including 40 Gigabit Ethernet, and 100 Gigabit Ethernet, as specified by U.S. IEEE 802 committee. Herein, Ethernet is a registered trademark. In processing for the frame rate in broader bandwidths, there are limitations to a processing rate by use of a serial signal, so that parallel expansion processing for frame signals (hereinafter referred to as parallelization) is essential.

In data communications, error control techniques, such as frame error detection and frame error correction is important for reliable frame transmission. A cyclic code is popular for detection of an error in a frames and correction of the error. The cyclic code includes a CRC (Cyclic Redundancy Check) code, hamming code, BCH code, and so forth, and those cyclic codes are in widespread use in a data communications technology as well.

In order to realize the higher speed data communications, it is necessary to establish broader bandwidth error control technologies by a cyclic code, especially CRC code. For that purpose, there is the need for CRC code computation processing of a parallelization signal of M bits, where M represents an optional positive integer not less than 2.

If an input frame length (n bits, where n represents a positive integer not less than 1) is not an integral multiple of a parallel width (M bits), fraction bits (which means the valid bits is less than M) are generated at the final processing word of the frame data. If parallel data containing the fraction bits is processed in a CRC calculation circuit of M bits, even invalid bits data other than the fraction bits will fall in a computation range of CRC codes, so that it is not possible to obtain a correct computation results.

A method for the parallel CRC computation for an input frame containing this kind of fraction bits is revealed in a letter contributed by H. Michael Ji, and Earl Killian to IEEE ICC 2002 (International Conference on Communications 2002), under the title of "Fast Parallel CRC Algorithm and Implementation on a Configurable Processor" (Non-patent Document 1).

There will be described hereinafter an example of a configuration of a CRC computation method relating to the invention. FIG. 18 is a block diagram showing an example of the configuration of a CRC computation method disclosed in Non-patent Document 1. Herein, there is shown the CRC calculation circuit for an input frame of M bits in width by way of example. The CRC calculation circuit, illustrated in FIG. 18, comprises a buffering unit 160-1, a read-out controller 160-2, a frame data rearrangement unit 160-3, a CRC computation unit 160-4, and a frame length counter 160-5.

The buffering unit 160-1 is supplied with, as input signals, a frame signal parallel-expanded to M bits in width, SOF (Start of Frame) information indicative of the head of the frame, and final word valid data information H(k) indicative of the end of the frame. The buffering unit 160-1 buffers the input frame and supplies the frame length counter 160-5 with a count enable signal CEN indicating that the frame is being buffered.

The frame length counter 160-5 counts a length of the frame on the basis of the count enable signal CEN from the buffering unit 160-1. Then, the frame length counter 160-5 supplies the frame length (referred to as frame length information LEN) to the read-out controller 160-2 and the frame data rearrange unit 160-3.

The read-out controller 160-2 executes read-out of frame data blocks from the buffering unit 160-1 on the basis of the frame length information LEN from the frame length counter 160-5, thereby delivering the frame data blocks to the frame data rearrangement unit 160-3.

The frame data rearrange unit 160-3 rearranges the frame data blocks such that invalid data blocks will be at the header of the frame according to the frame length information LEN from the frame length counter 160-5. A region of the invalid data blocks has a value '0'.

The CRC computation unit 160-4 executes CRC computation of the frame data of M bits in width, produced by the frame data rearrangement unit 160-3.

Referring now to FIGS. 19A and 19B, there will be described an operation of the CRC calculation circuit illustrated in FIG. 18. FIGS. 19A and 19B are a schematic illustration showing an example of rearrangement of the frame data in the CRC calculation circuit illustrated in FIG. 18. FIG. 19A shows an example of input frame data in the case of a parallel width M=8 bits, and a frame length n=29 bits. The final word valid data information H(k) represents bit numbers of fraction bits, being '5' in this example. In FIGS. 19A and 19B, a data unit as an object of CRC computation is indicated by '18-1-1' to '18-4-5', while a black filled-in portion of the input frame data indicates data units (invalid data units) other than the subjects of the CRC computation.

Upon the frame data, illustrated in FIG. 19A, being inputted, the buffering unit 160-1 buffers the frame data and delivers the count-enable signal CEN to the frame length counter 160-5.

The frame length counter 160-5 counts the frame length on the basis of the count-enable signal CEN. Upon the final word valid data information H(k) being received, the buffering unit 160-1 completes buffering, and the frame length counter 160-5 delivers the frame length information LEN to the read-out controller 160-2 and the frame data rearrangement unit 160-3. The read-out controller 160-2 reads out the frame data from the buffering unit 160-1 on the basis of the frame length information LEN from the frame length counter 160-5, thereby delivering the frame data to the frame data rearrangement unit 160-3.

The frame data rearrangement unit 160-3 counts the number of the invalid data blocks (3 bits in this case) from the frame length information LEN (29 bits in this example) and the parallel width M=8 bits, thereby rearranging the frame data so that the invalid data becomes the header of the frame. FIG. 19B shows data units rearranged by the frame data rearrangement unit 160-3 to be produced. A portion at the leading head of the frame data, corresponding to 3 bits (a black portion in FIG. 19B), represents the invalid data, and the region of the invalid data has a value '0'. The rearranged data units including the invalid data units positioned at the head have 32 bits in total, which is a multiple of the parallel width M=8 bits. Inasmuch as the value of the region of the invalid data units is '0', results of the CRC computation are not affected. The CRC computation unit 160-4 of 8 bits in width executes CRC computation against an output of the frame data rearrangement unit 160-3, thereby obtaining correct results of the CRC computation of '18-1-1' to '18-4-5', illustrated in FIG. 19B, each as the data unit of a frame as the object of the CRC computation.

In Japanese Unexamined Patent Application Publication No. 2002-359561 (Patent Document 1), there is described the CRC calculation circuit for serial data of CRC-32.

With the CRC computation method disclosed in Nonpatent Document 1, however, it is necessary to calculate a frame length beforehand in order to rearrange the frame data blocks. In the case of a frame where the frame length information LEN (length information) is contained in the header of a frame, the frame length information LEN can be easily acquired, however, in the case where frame length information is not held in the header of a frame as with the case of an Ethernet frame, it is necessary to execute buffering in order to acquire the frame length. In the configuration illustrated in FIG. 18, processing at the buffering unit 160-1 and processing at the frame length counter 160-5 correspond to processing for calculating the frame length.

Buffering processing executed as above will cause the following problem.

Firstly, there will be an increase in processing delay. Inasmuch as buffering is executed in order to calculate a frame length, there is the need for buffering at least one frame or more. Accordingly, processing time for buffering, commensurate with the frame length, is required, resulting in an increase in delay Secondly, there will be an increase in circuit size. As in the case of the configuration illustrated in FIG. 18, if the buffering unit 160-1, the read-out controller 160-2, the frame length counter 160-5, and the frame data rearrangement unit 160-3 are installed in the front stage of the CRC computation unit 160-4, this will cause a system in whole to increase in scale.

Thirdly, there will be constraints on implementation of a broader band. This problem is attributable to buffering of a broadband. An upper limit occurs to a processing band for buffering owing to band constraints of a memory in use and a circuit operating speed. In a frame communications technology of several tens of Gbps class, there are needs for not only an increase in the parallel width M of frame processing but also an increase in processing clock speed, but due to presence of constraints on an input/output band of the memory, in particular, broadening of the band is constrained. In the method for the parallel CRC computation, using buffering, illustrated in FIG. 18, the memory is used for the buffering, and constraints occur to the speed, so that constraints occur to the implementation of the broader band, as well.

SUMMARY OF THE INVENTION

It is an exemplary object of the invention to provide a parallel cyclic code generation device which is capable of eliminating the need for buffering in order to calculate frame length as an object of computation in parallel code computation processing of data.

It is another exemplary object of the invention to provide a parallel cyclic code error detection device which is capable of eliminating the need for buffering in order to calculate frame length as an object of computation in parallel code computation processing of data.

A parallel cyclic code generation device according to a first aspect of the invention is a parallel cyclic code generation device for executing division against data as an object of cyclic code generation, optional in bit length, by a generation polynomial, for every M bits, thereby generating cyclic codes. The parallel cyclic code generation device includes a data dividing unit, an R(x) generation unit, a first exclusive-OR unit, a first shifting unit, an R'(x) generation unit, a second shifting unit, and a second exclusive-OR unit. The data dividing unit parallel-produces bit strings contained in data as the object of the cyclic code generation, so as to be M bits in width, respectively, thereby dividing the data as the object of the cyclic code generation into an integral multiple bits block A(x) and a fraction bits block B(x). The integral multiple bits block A(x) is a data block of the object of the cyclic code generation, with a length corresponding to an integral multiple of M bits from the header of the data as the object of the cyclic code generation. The fraction bits block B(x) is a data block of the object of the cyclic code generation, less than M bits, excluding the integral multiple bits block A(x). The R(x) generation unit generates a cyclic code R(x) as the cyclic code of the integral multiple bits block A(x). The first exclusive-OR units executes computation of exclusive-OR of the cyclic code R(x) and a data string of M bits, containing the fraction bits block B(x). The first shifting unit shifts the exclusive-OR of the cyclic code R(x) and the data string of M bits, containing the fraction bits block B(x), by {M−H(k)} bits toward a least significant side in the case of a bit length of the fraction bits block B(x) being H(k) bits. The first shifting unit sets 0 to {M−H(k)} bits on a most significant side. The R'(x) generation unit generates a cyclic code R'(x) that is a cyclic code of the data subjected to shifting and setting to 0, by the first shifting unit. The second shifting unit shifts the cyclic code R(x) by H(k) bits toward a most significant side, thereby generating data R"(x) that is data obtained by setting 0 to H(k) bits on a least significant side. The second exclusive-OR units executes computation of exclusive-OR of the cyclic code R'(x) and the data R"(x).

A parallel cyclic code error detection device according to a second aspect of the invention is a parallel cyclic code error detection device for executing division against data containing cyclic codes, as an object of inspection, optional in bit length, by a generation polynomial, for every M bits, thereby inspecting an error in data. The parallel cyclic code error detection device includes a data dividing unit, an R(x) generation unit, a bits concatenating unit, a shifting unit, and a C(x) generation unit. The data dividing unit parallel-produces bit strings contained in data as the object of the inspection, so as to be M bits in width, respectively, thereby dividing the data as the object of the inspection into an integral multiple bits block A(x) and a fraction bits block B(x). The integral multiple bits block A(x) is a data block of the object of the inspection, with a length corresponding to an integral multiple of M bits from the header of the data as the object of the inspection. The fraction bits block B(x) is a data block of the object of the inspection, less than M bits, excluding the integral multiple bits block A(x). The R(x) generation unit generates a cyclic code R(x) as the cyclic code of the integral multiple bits block A(x). The bits concatenating unit concatenates the cyclic code R(x) with a data string of M bits, containing the fraction bits block B(x), The shifting unit shifts the data concatenated the cyclic code R(x) with the data string of M bits, containing the fraction bits block B(x), by {M−H(k)} bits toward a least significant side in the case of a bit length of the fraction bits block B(x) being H(k) bits. The shifting unit sets 0 to {M−H(k)} bits on a most significant side. The C(x) generation unit generates a cyclic code C(x)

that is a cyclic code of the data subjected to shifting and setting to 0, by the shifting unit.

BRIEF DESCRIPTION OF THE DRAWINGS

FIGS. 3A through 3F are a timing chart of input signals and output signals of a header imparting unit and a parallel CRC processing unit;

FIGS. 4A through 4J are a timing chart showing inputs and outputs of constituents of the parallel CRC processing unit;

FIGS. 12A through 12D shows respective timing charts of frames supplied to a PCS unit, and respective timing charts of the frames and the signals, produced by the PCS unit;

FIGS. 13A through 13I are a timing chart showing inputs and outputs of respective constituent elements of a parallel CRC error detection unit;

FIGS. 14A, 14B, and 14C are a schematic illustration showing computation for concatenating R(x) with B(x);

FIGS. 19A and 19B are a schematic illustration showing an example of rearrangement of frame data in the CRC calculation circuit shown in FIG. 18 by way of example.

DESCRIPTION OF THE EXEMPLARY EMBODIMENTS

Figure 1:
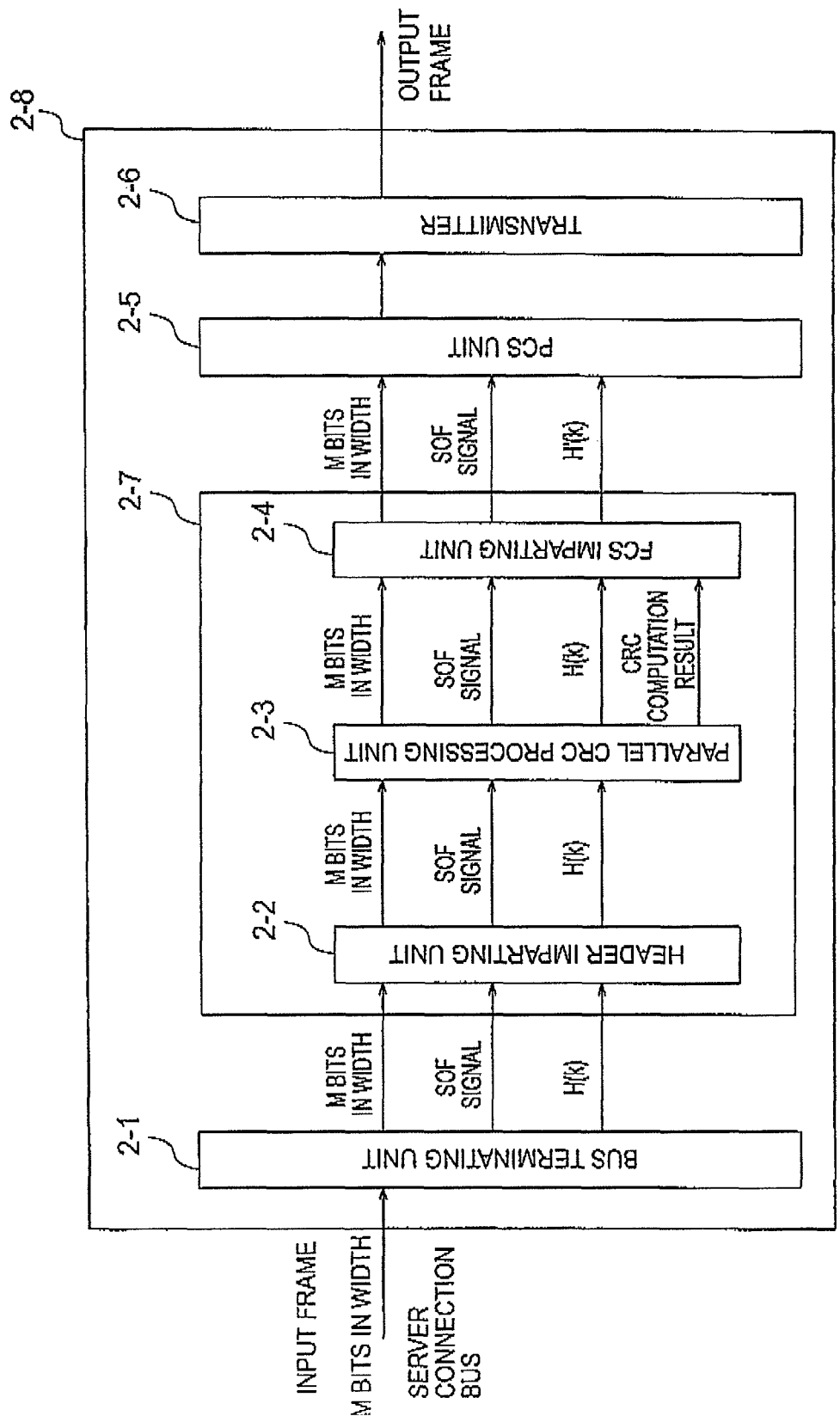
FIG. 1 is a block diagram showing a configuration example of a transmission function of a network interface card to which the present invention is applied.

With the invention, there is executed an operation to calculate a cyclic code without using the frame length. Alternatively, there is executed a cyclic code error detection without using the frame length information. There is illustrated hereinafter execution of those operations without using the frame length. Further, in the following description, explanation is given by taking an example of the case of using a CRC value as the cyclic code.

First, it is illustrated that the CRC value can be calculated without using the frame length. It is assumed that an input frame of n bits in length is N(x). A frame length n bits is optional. It is assumed that a parallel width is M bits, where M represents a positive integer not less than 2. Further, an integral multiple bits block with bits corresponding to an integral multiple of the parallel width M bits in the frame N(x) is denoted in A(x). In addition, a fraction bits block in the input frame N(x) is denoted in B(x). The integral multiple bits block A(x) is a bit block with a length corresponding to an integral multiple of the parallel width M bits counted from the header of the frame N(x). The fraction bits block B(x) is a bit block of less than M bits, other than the integral multiple bits block A(x) in the input frame N(x). The fraction bit block B(x) follows the integer multiple bits block A(x). If the frame N(x) is divided into the integral multiple bits block A(x) and the fraction bit block B(x), the frame N(x) can be expressed by formula (1). Further, in each of the following formulas, "+" indicates exclusive-OR, and "mod" indicates modulo-2 operation. Further, H(k) is a length (bit length) of the fraction bits block B(x) of a k-th input frame, where k represents an optional positive integer. G(x) indicates a generated polynomial, and d is an order of G(x). Further, x is a variable for use in expressing high-order formula.

$$N(x) = A(x) \cdot x^{H(k)} + B(x) \qquad \text{formula (1)}$$

Further, assuming that results of CRC computation of the integral multiple bits block A(x) are R(x), R(x) can be expressed by formula (2).

$$R(x) = [A(x) \cdot x^d] \bmod G(x) \qquad \text{formula (2)}$$

Further, assuming that results of CRC operation of the frame N(x) are R'''(x), R'''(x) can be expressed by formula (3).

$$R'''(x) = \{N(x) \cdot x^d\} \bmod G(x) \qquad \text{formula (3)}$$

Herein, on the basis of the formula (i) and the formula (3), R'''(x) can be expressed by formula (4).

$$R'''(x) = \{[A(x) \cdot x^d \cdot x^{H(k)}] + [B(x) \cdot x^d]\} \bmod G(x) \qquad \text{formula (4)}$$

Further, the formula (4) can be transformed into the following formula (5) on the basis of the formula (2):

$$R'''(x) = \{[R(x) \cdot x^{H(k)}] + [B(x) \cdot x^d]\} \bmod G(x) \qquad \text{formula (5)}$$

Still further, the formula (5) can be transformed into the following formula (6):

$$R'''(x) = \{[R(x) \cdot x^{H(k)-d} + B(x)] \cdot x^d\} \bmod G(x) \qquad \text{formula (6)}$$

However, if the respective blocks are made up as expressed by the formula (6), a portion of R(x) will disappear on conditions of H(k)<d, so that it is not possible to obtain correct results of the CRC operation. Accordingly, if R(x) is expanded as shown by formula (7), and a portion of an formula concerning R(x), with an order in a range of from "d−1" to "d−H(k)", is designated R1 while a portion of the formula, with an order in a range of from "d−H(k)−1" to "0", is designated R2, the flowing formula (8) will hold.

$$R(x) = r_{(d-1)} \cdot x^{d-1} + \ldots + r_{(d-H(k))} \cdot x^{d-H(k)} + r_{(d-H(k)-1)} \cdot x^{d-H(k)-1} + \ldots + r_{(0)} \cdot x^0 \qquad \text{formula (7)}$$

$$R(x) = R1(x) + R2(x) \qquad \text{formula (8)}$$

On the basis of the formula (8) and the formula (6), as above, the results of the CRC operation of the frame N(x), that is, R'''(x), can be expressed as the following formula (9):

$$R'''(x) = \{[R1(x) \cdot x^{H(k)-d} + B(x)] \cdot x^d + R2(x) \cdot x^{H(k)}\} \bmod G(x) \qquad \text{formula (9)}$$

Herein, [R2(x)·$x^{H(k)}$] in the formula (9) is replaced with R"(x). A length (bit length) of R"(x) is d bits, d being equal to the order of G(x). Therefore, R"(x) can be moved out of mod G(x).

Further, a length of [R1(x)·$x^{H(k)-d}$+B(x)] is H(k) bits, and if the results of this addition are B'(x), the formula (9) can be expressed by the following formula (10):

$$R'''(x) = \{[B'(x)]\cdot x^d\} \bmod G(x) + R''(x) \qquad \text{formula (10)}$$

If $\{[B'(x)]\cdot x^d\}$ mod G(x) is replaced with R'(x), R'''(x) can be expressed by formula (11).

$$R'''(x) = R'(x) + R''(x) \qquad \text{formula (11)}$$

A CRC code processing block for CRC generation can be made up as expressed by the formula (11). Further, R2(x) does not exist on conditions of H(k)>d, an R'(x) value will be an R'''(x) value.

Figure 18:
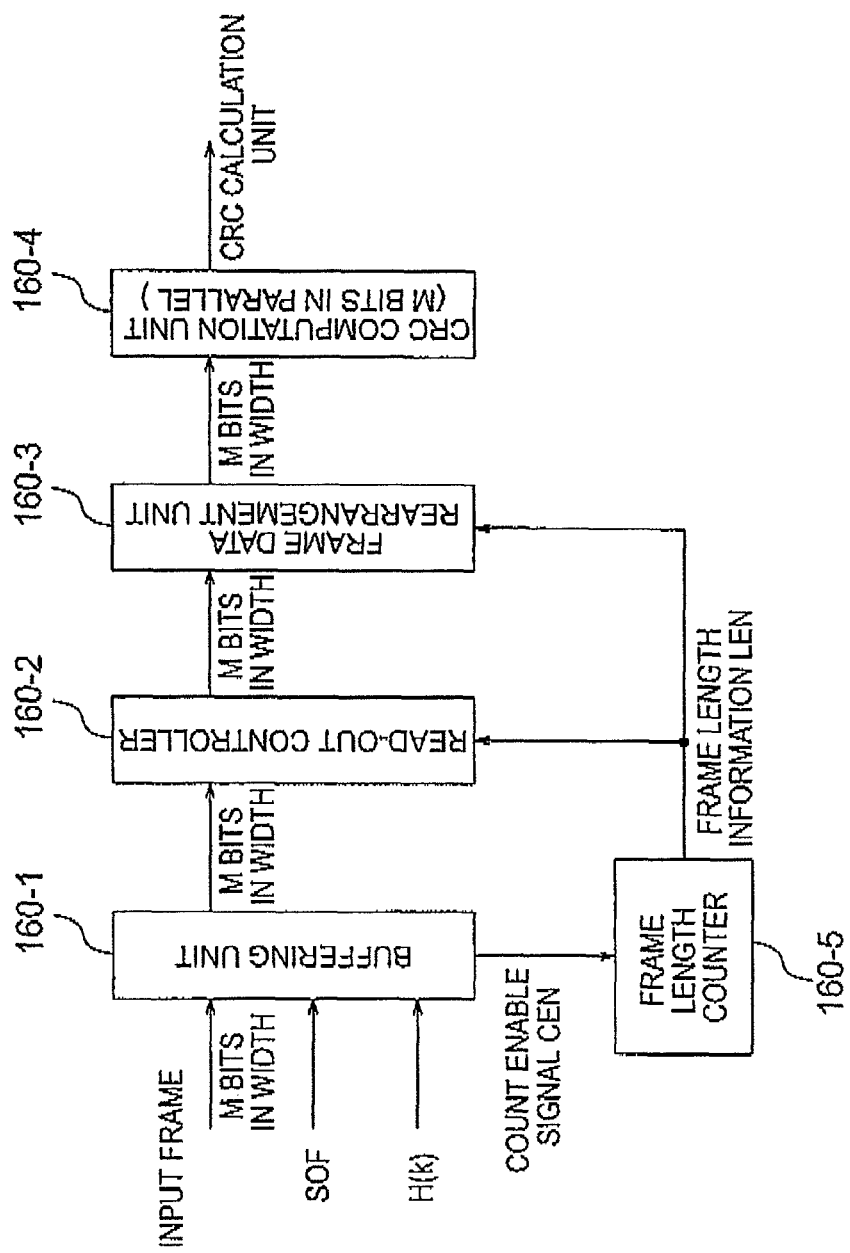
FIG. 18 is a block diagram showing an example of the configuration of a CRC computation method disclosed in Non-patent Document 1.

If a CRC value $\{R'''(x)\}$ is calculated on the basis of the formula (10) and the formula (11), it is possible to work out R'''(x) without calculating the length n (the frame length information) of the frame N(x), so that it is possible to dispense with buffering for calculating the frame length as with the case of the configuration illustrated in FIG. 18 and the rearrangement of the data as illustrated in FIG. 19B. Further, an operation for calculating the CRC value $\{R'''(x)\}$ on the basis of the formula (10) and the formula (11) can be implemented by means of calculating exclusive-OR for finding B'(x), means of executing p $\{p=M-H(k)\}$ bit shift in order to carry out CRC computation of B'(x)_H(k) bits long in the CRC calculation circuit of M bits input, means of executing q $\{q=H(k)\}$ bit shift of R(x) in order to obtain R"(x), means of calculating exclusive-OR of R'(x) and R"(x), and means of executing CRC computation, By those means using the bit length of the fraction bits block, that is, H(k) bits and the order d of the generated polynomial, the CRC value $\{R'''(x)\}$ of N(x) can be calculated.

Next, it is shown hereinafter that inspection of a CRC value can be conducted without using frame length. It is assumed that an input frame N'(x) for error detection of the CRC value belongs to a code series containing the CRC value $\{R'''(x)\}$, and an object range for CRC processing is counted from the header of the frame to the CRC value, and the CRC value R(x) of A(x) is equal to 'A(x) mod G(x)'. Then, if B(x) in the formula (5) contains the CRC value $\{R'''(x)\}$, the formula (5) can be expressed by formula (12).

$$C(x) = \{[R(x)\cdot x^{H(k)}] + [B(x)]\} \bmod G(x) \qquad \text{formula (12)}$$

C(x) of the formula (12) represents the results of the error detection as well as the CRC operation, and it can be said that input frame data has no error if a C(x) value='0'. In the formula (12), [R(x)·$x^{H(k)}$] is (d+H(k)) bits long, and B(x) is H(k) bits long, and if the right-hand side of the formula (12) is replaced with B"(x), the formula (12) can be expressed as follows:

$$C(x) = \{B''(x)\} \bmod G(x) \qquad \text{formula (13)}$$

The length of B"(x) is (d+H(k)) bits long. The d bits of most significant side the B"(x) is the R(x), the H(k) bits of least significant side in B"(x) is the B(x). Thus, B"(x) is obtained by concatenating R(x) with most significant bit side of B(x).

If C(x) is calculated on the basis of the formula (13), it is possible to dispense with the buffering for calculating the frame length and the rearrangement of the data as illustrated in FIG. 19B. The error detection of the N(x) can be executed by means of concatenating for obtaining B"(x), means of executing bit shift in order to carry out CRC computation of B"(x) (d+H(k)) bits long in the CRC calculation circuit of (d+M) bits input, and means of executing the CRC computation.

Embodiments of the present invention are described hereinafter with reference to the accompanying drawings. With each of the embodiments described hereinafter, the case of a cyclic code representing the CRC value is described by way of example.

Exemplary Embodiment 1

A first exemplary embodiment illustrates a parallel cyclic code generation device for executing an operation to generate the cyclic code. FIG. 1 is a block diagram showing a configuration example of a transmission function of a network interface card (NIC: Network Interface Card) to which the present invention is applied. The network interface card 2-8 illustrated in FIG. 1 includes the parallel cyclic code generation device for executing the operation to generate the cyclic code. The network interface card is a card mounted on a server, a computer, and so forth, for use in executing processing for transmitting and receiving frames.

The network interface card 2-8 according to the present invention comprises a bus terminating unit 2-1, a MAC framing unit 2-7, a PCS (Physical Coding Sublayer) unit 2-5, and a transmitter 2-6.

The MAC framing unit 2-7 executes processing for generation of transmission MAC frames. The MAC framing unit 2-7 comprises a header imparting unit 2-2, a parallel CRC processing unit 2-3, and an FCS imparting unit 24.

In the network interface card 2-8 illustrated in FIG. 1, the bus terminating unit 2-1 is connected to a CPU bus inside a server (not shown) by a server connection bus. Further, the transmitter 2-6 is connected to a transmission line for transmitting the frames to outside. The network interface card 2-8 imparts a frame header and FCS (Frame Check Sequence) to a frame supplied from the server before transmitting the same to the transmission line.

The bus terminating unit 2-1 receives a frame sent from the server (not shown). This frame is a frame of M bits in width. That is, this is a frame delivered on a word-by-word basis with M bits as one word. The bus terminating unit 2-1 generates an SOF signal indicative of the head of the frame and a final word valid data signal H(k) indicative of the trailer of the frame on the basis of the frame sent from the server, thereby delivering, to the header imparting unit 2-2, the SOF signal and the final word valid data signal H(k) together with the frame of M bits in width. Further, the bus terminating unit 2-1 produces the SOF signal at the time of, for example, producing M bits at the head of the frame. Still further, the bus terminating unit 2-1 produces the final word valid data signal H(k), at the time of, for example, producing a fraction bits block B(x) at the trailer of the frame. Furthermore, a bit length of the fraction bits block B(x) is produced as the final word valid data signal H(k).

The header imparting unit 2-2 imparts a frame header to the output frame of the bus terminating unit 2-1, thereby delivering the frame with the frame header added thereto, together with SOF and H(k), to the parallel CRC processing unit 2-3. Impartation of the frame header is accompanied by an increase in the length of the frame, so that the fraction bits block B(x) as well undergoes a change. The header imparting unit 2-2 renews the value of the final word valid data signal H(k) to match a bit length of the fraction bits block B(x) after the impartation of the frame header, thereby producing H(k).

The parallel CRC processing unit 2-3 executes computation of a CRC code against the frame of M bits in width, produced by the header imparting unit 2-2.

The FCS imparting unit 24 imparts a CRC value computed by the parallel CRC processing unit 2-3, serving as an FCS value, to the trailer of the frame. As a result of impartation of the FCS value, the length of the frame increases, so that the fraction bits block B(x) as well undergoes a change. The FCS imparting unit 24 renews the value of the final word valid data signal H(k) to match a bit length of the fraction bits block B(x) after the impartation of the FCS value, thereby producing H(k).

The PCS unit 2-5 executes coding of the frame of M bits in width, sent from the FCS impart unit 2-4. Herein, the coding refers to coding for sending out to the transmission line for 8B/10B encoding, 64B/66B encoding, and so forth.

The transmitter 2-6 executes parallel-serial conversion of the data produced by the PCS unit 2-5 to be subsequently delivered to the transmission line.

Figure 2:
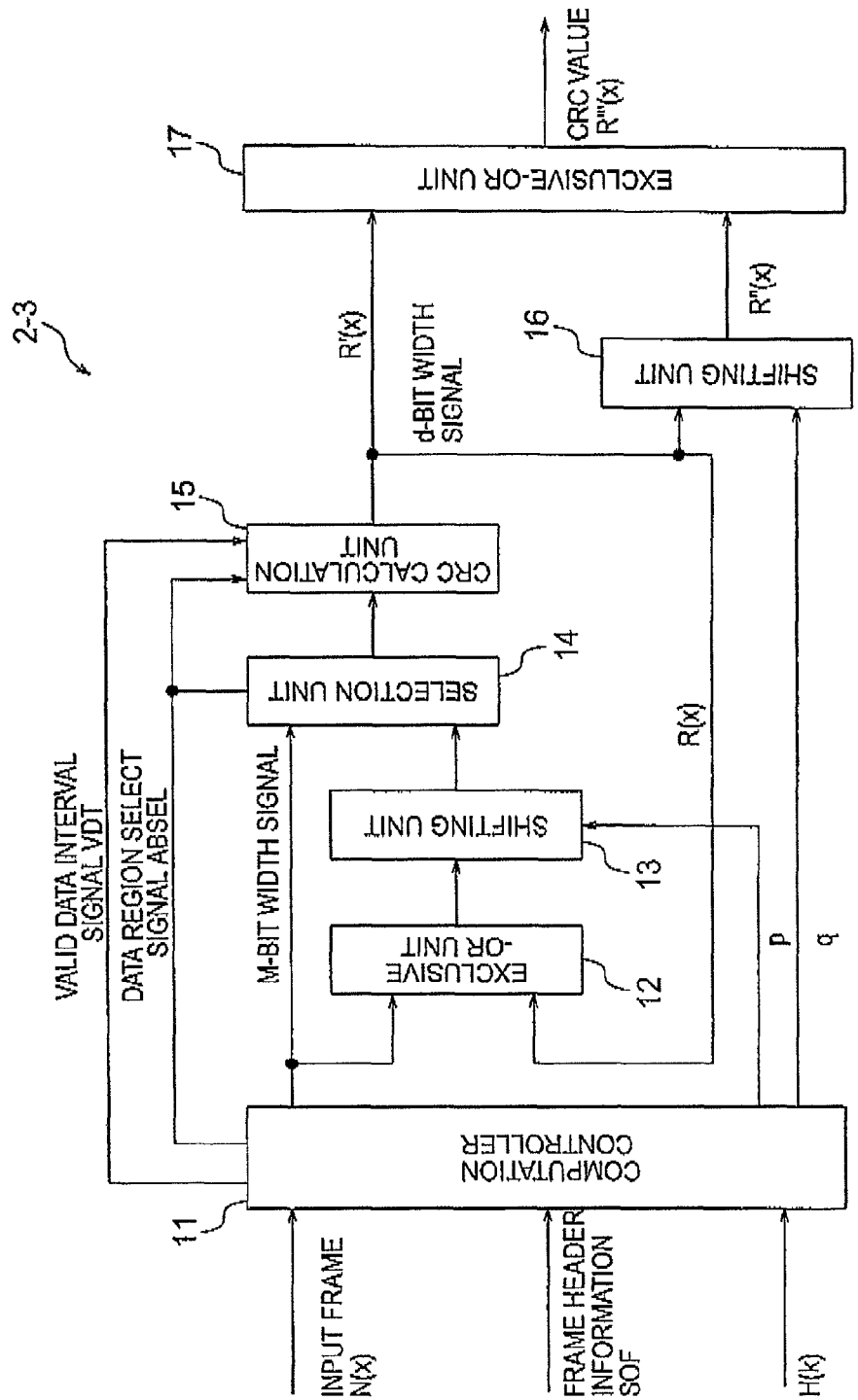
FIG. 2 is a block diagram showing a parallel CRC processing unit (a parallel cyclic code generation device) according to a first exemplary embodiment of the present invention.

The parallel CRC processing unit 2-3 is the parallel cyclic code generation device according to the invention. FIG. 2 is a block diagram showing the parallel CRC processing unit 2-3 according to the first embodiment of the present invention. Referring to FIG. 2, the parallel CRC processing unit 2-3 will be described hereinafter.

First, there is described hereinafter the most significant bit and the least significant bit in a bit string of parallel width M bits. The fraction bits block B(x) of the frame is sequentially stored from an end of the bit string of the parallel width M bits, in the order of bit data making up B(x). One end of both the ends of the bit string of the M bits, for storing the bit data making up B(x), is defined as most significant while the other end is defined as least significant.

The cyclic code (the CRC value) computed in connection with the integral multiple bits block A(x) is expressed by d bits, and respective bits correspond to respective terms of the polynomial, as expressed in the formula (7). With the cyclic code as computed in connection with the integral multiple bits block A(x), a bit corresponding to the highest-order term of the polynomial {the formula (7)} is defined as the most significant bit, and a bit corresponding to the lowest-order term (term raised to the 0-th power) is defined as the least significant bit.

If a bit length n of an input frame k (k is an optional positive integer), as an object of CRC computation, is not an integral multiple of M, the parallel CRC processing unit 2-3 divides the input frame into the integral multiple bits block A(x) with a length corresponding to the integral multiple of the parallel width M bits, and the fraction bits block B(x). Herein, k represents a sequence number of the frame. The parallel CRC processing unit 2-3 executes computation of exclusive-OR of the result R(x) of CRC computation of the integral multiple bits block A(x) and the fraction bits block B(x) with a bit length H(k). The parallel CRC processing unit 2-3 generates a signal of total M bits in width, formed by shifting computation results of the exclusive-OR of R(x) and B(x) by p bits toward the least significant bit and by adding "0" to p bits on a most significant side. Herein, p=M−H(k). The parallel CRC processing unit 2-3 executes CRC computation against the signal M bits in width to thereby work out a CRC computation result R'(x). Further, the parallel CRC processing unit 2-3 shifts R(x) by q bits toward a most significant side to compute data R"(x) of d bits in total, obtained by adding "0" to q bits on a least significant side, thereby computing exclusive-OR of R'(x) and R"(x). Herein, q=H(k). As a result of those processing, the parallel CRC processing unit 2-3 implements parallel CRC processing without execution of buffering for calculating the bit length of a frame. The CRC value {R'"(x)} as expressed by the formula (11) can be calculated due to the processing described as above.

As shown in FIG. 2, the parallel CRC processing unit 2-3 comprises a computation controller 11, a first exclusive-OR unit 12, a first shifting unit 13, a selection unit 14, a CRC calculation unit 15, a second shifting unit 16, and a second exclusive-OR unit 17.

The computation controller 11 discriminates the integral multiple bits block A(x) of the k-th input frame and the fraction bits block B(x) thereof from the SOF signal and fraction bit numbers H(k), respectively, to be thereby delivered to the selection unit 14 and the first exclusive-OR unit 12.

Further, H(k) representing bit numbers of the fraction bits block B(x) is the final word valid data information to be sent out along with the fraction bits block B(x).

The computation controller 11 generates first and second pieces of shift information p and q representing shift volume of bits, thereby delivering the first and the second pieces of shift information p and q to the first shifting unit 13 and the second shifting unit 16, respectively. In this case, p=M−H(k), and q=H(k). The computation controller 11 may generate the first piece of shift information p by computing M−H(k). Further, the computation controller 11 may adopt a value of H(k) as the second piece of shift information q.

The computation controller 11 generates a valid data interval signal VDT indicating that a bit string belonging to a frame is being inputted, and delivers the valid data interval signal VDT to the CRC calculation unit 15 during inputting of the bit string of the frame {that is, during a time period from inputting of SOF to inputting of H(k)}.

Further, the computation controller 11 delivers, to the selection unit 14 and the CRC calculation unit 15, a data region select signal ABSEL indicating which of the integral multiple bits block A(x) and the fraction bits block B(x) is being produced.

If the frame length of the input frame is an integral multiple of M bits, the computation controller 11 produces the integral multiple bits block A(x) only, but does not produce the fraction bits block B(x).

The first exclusive-OR unit 12 aligns the CRC value R(x) of the integral multiple bits block A(x) which is calculated by the CRC calculation unit 15 with the most significant bit of the fraction bits block B(x), thereby calculating the exclusive-OR of the CRC value R(x) of the integral multiple bits block A(x) and the fraction bits block B(x).

In order to cause the CRC calculation unit 15 of M bits in width to process results of computation of the exclusive-OR which is calculated by the first exclusive-OR unit 12, the first shifting unit 13 shifts the results of the computation of the exclusive-OR by p {p=M−H(k)} bits toward the least significant bit. The first shifting unit 13 sets "0" to p bits on the most significant side where data will be lost as a result of shifting. The first shifting unit 13 delivers results of shift-processing to the selection unit 14. Inasmuch as the computation results of the CRC value does not undergo a change due to "0" as set in the shift-processing, an object of computation by the CRC calculation unit 15 will be H(k) bits.

The selection unit 14 executes processing for switchover between the integral multiple bits block A(x) with a length corresponding to the integral multiple of M bits of the input frame and an output of the first shifting unit 13 in accordance with the data region select signal ABSEL generated by the computation controller 11. More specifically, when the data region select signal ABSEL indicates outputting of the integral multiple bits block A(x), the selection unit 14 delivers the integral multiple bits block A(x) to the CRC calculation unit

15. When the data region select signal ABSEL indicates outputting of the fraction bits block B(x), the selection unit 14 delivers output data of the first shifting unit 13 to the CRC calculation unit 15, In the case where the input frame length is an integral multiple of M bits, the fraction bits do not exist, so that the output of the first shift unit 13 will not be selected.

The CRC calculation unit 15 executes CRC calculation against the data M bits in width that is produced by the selection unit 14. The CRC calculation unit 15 is made of the CRC calculation circuit including a circuit for multiplication of $x^d$.

The second shifting unit 16 shifts the output R(x) of the CRC calculation (15) against the integral multiple bits block A(x) with the length corresponding to the integral multiple of M bits of the input frame by q $\{q=H(k)\}$ bits toward a most significant side, thereby allocating "0" to q bits on the least significant side. This is processing necessary for obtaining a portion of R(x), otherwise deleted by the first shifting unit 13, in the case of [H(k)<d]. Herein, R(x) is the output (the CRC value) of the CRC calculation unit 15 against the integral multiple bits block A(x) with the length corresponding to the integral multiple of M bits of the input frame. The second shifting unit 16 executes shift-processing by q bits, thereby delivering results of allocating "0" to q bits on the least significant side to the second exclusive-OR unit 17.

In order to obtain the CRC value of the input frame, the second exclusive-OR unit 17 executes processing for exclusive-OR of the output of the second shift unit 16 and the output of the CRC calculation unit 15 against the output of the first shift unit 13.

Next, there will be described hereinafter respective operations of the network interface card illustrated in FIG. 1 and the parallel CRC processing unit 2-3 (the parallel cyclic code generation device) illustrated in FIG. 2.

FIGS. 3A through 3F are a timing chart of input signals and output signals of the header imparting unit 2-2 and the parallel CRC processing unit 2-3. FIGS. 3A, 3B, and 3C indicate a frame, SOF, and H(k) which are produced by the header imparting unit 2-2 to be supplied to the parallel CRC processing unit 2-3, respectively. Similarly, FIGS. 3D, 3E, and 3F indicate a frame, SOF, and H(k) which are produced by the FCS imparting unit 2-4, respectively.

Upon a frame being received from an upper layer, the bus terminating unit 2-1 (refer to FIG. 1) generates the SOF signal indicative of the head of the frame and the final word valid data signal H(k) indicative of the trailer of the frame to be delivered, together with the frame of M bits in width, to the header imparting unit 2-2. The bus terminating unit 2-1 produces the SOF signal at the time of producing the first M bits of the frame. The bus terminating unit 2-1 produces the bit numbers of the fraction bits block B(x) as the final word valid data signal H(k) at the time of producing the fraction bits block B(x) at the trailer of the frame.

The header imparting unit 2-2 imparts the header to the frame supplied from the bus terminating unit 2-1, thereby delivering the frame with the header imparted thereto to the parallel CRC processing unit 2-3. Further, the header imparting unit 2-2 delivers SOF and H(k) after renewed to the parallel CRC processing unit 2-3 (refer to FIGS. 3A, 3B, and 3C). The header imparting unit 2-2 produces the SOF signal at the time of producing the first M bits of the frame after the header is imparted thereto. The header imparting unit 2-2 produces further the bit numbers of the fraction bits block B(x) as the final word valid data signal H(k) at the time of producing the fraction bits block B(x) at the trailer of the frame. Inasmuch as the impartation of the header will cause the bit numbers of the fraction bits block B(x) to undergo a change, bit numbers of the fraction bits block B(x) after the header is imparted are produced as H(k).

The parallel CRC processing unit 2-3 executes computation of the CRC value of the frame (schematically indicated by a thick line in FIG. 5A) produced by the header imparting unit 2-2 and delivers results of the computation to the FCS imparting unit 24. Further, the parallel CRC processing unit 2-3 delivers the frame, SOF, and H(k) to the FCS imparting unit 24.

The FCS imparting unit 2-4 imparts the CRC value as computed by the parallel CRC processing unit 2-3, as FCS, to the trailer of the frame supplied from the parallel CRC processing unit 2-3 (refer to FCS 3-1, FCS 3-2, shown in FIG. 3D). Then, the FCS imparting unit 2-4 delivers the frame with FCS imparted thereto, SOF, and H(k) to the PCS unit 2-5 (refer to FIGS. 3D, 3E, and 3F). The FCS imparting unit 24 produces the SOF signal at the time of producing the first M bits of the frame after FCS is imparted thereto. The FCS imparting unit 2-4 produces further the bit numbers of the fraction bits block B(x) as the final word valid data signal H(k) at the time of producing the fraction bits block B(x) at the trailer of the frame. Inasmuch as the impartation of FCS will cause the bit numbers of the fraction bits block B(x) to undergo a change, bit numbers of the fraction bits block B(x) after FCS is imparted are produced as H(k).

The PCS unit 2-5 executes coding of the frame delivered from the FCS imparting unit 2-4 to be subsequently delivered to transmitter 2-6.

The transmitter 2-6 executes the parallel-serial conversion of the data M bits in width from the PCS unit 2-5 to be subsequently sent to the transmission line.

Next, there will be described hereinafter an operation of the parallel CRC processing unit 2-3. FIGS. 4A through 4J are a timing chart showing inputs and outputs of respective constituents of the parallel CRC processing unit 2-3. FIGS. 4A, 4B, and 4C indicate SOF, H(k), and a frame which are supplied to the computation controller 11, respectively. Further, FIG. 4D indicates the frame supplied to the computation controller 11 in units of the word (string). Each of the words is M bits. FIGS. 4E and 4F indicate the output of the selection unit 14 and the output of the CRC calculation unit 15, respectively. FIGS. 4G to 4J indicate VDT, ABSEL, the first piece of shift information p, and the second piece of shift information q, respectively.

As shown in FIGS. 4A to 4D, respectively, the computation controller 11 is supplied from the header impart unit 2-2 (refer to FIG. 1) with the frame M bits in width serving as the object of the CRC computation, the SOF signal indicative of the head of the frame, and the final word valid data signal H(k) indicative of fraction bit numbers at the trailer of data.

If the bit length of the frame supplied to the computation controller 11 is not an integral multiple of the parallel width M bits, the frame contains the integral multiple bits block A(x) with the length corresponding to the integral multiple of M bits and the fraction bits block B(x) with the bit length H(k). Data $\{$'a(x) #1' to 'a(x) #(w−1)'$\}$, corresponding to a first word string to a(w−1)-th word string, respectively, in whole, represent the integral multiple bits block A(x). Further, each of the data $\{$'a(x) #1' to 'a(x) #(w−1)'$\}$ of the respective word strings of A(x) is a data string of M bits in width, and each of '#1' to '#(w−1)' represents a word string number within the data of the frame. Still further, data 'b(x)' of a w-th word string is a bit string containing the fraction bits block B(x).

As shown in FIGS. 4A to 4D, respectively, upon input of the frame and the signals {SOF, H(k)}, the computation controller 11 delivers the valid data interval signal VDT as a state indicative of "valid (the bit string belonging to the frame is being supplied)" to the CRC calculation unit 15 (refer to FIG. 4G) during a time period from the input of SOF to the input of H(k). In FIG. 4G, a 'H'(high) level indicates valid while an 'L' (low) level indicates invalid (the bit string belonging to the frame is not being supplied).

Further, the computation controller 11 delivers, to the selection unit 14 and the first exclusive-OR unit 12, the integral multiple bits block A(x) and the fraction bits block B(x) which are contained in the input frame. Still further, the computation controller 11 delivers, to the selection unit 14 and the CRC calculation unit 15, the data region select signal ABSEL indicative of "A(x) side" during a time period over which the respective data strings of the word strings ranging from the first word string to the (w−1)-th word string, constituting the integral multiple bits block A(x), are supplied to be produced. When the bit strings containing the fraction bits block B(x) are supplied to be produced, the computation controller 11 delivers, to the selection unit 14 and the CRC calculation unit 15, the data region select signal ABSEL indicative of "B(x) side". In FIG. 4H, an 'H' (high) level indicates "A(x) side" while an 'L' (low) level indicates "B(x) side".

In accordance with the data region select signal ABSEL shown in FIG. 4H, the selection unit 14 delivers, to the CRC calculation unit 15, the data 'a(x) #1' to 'a(x) #(w−1)' of the respective word strings from the first word string to the (w−1)-th word string supplied from the computation controller 11, when the data region select signal ABSEL indicates "A(x) side". Then, when the data region select signal ABSEL indicates "the B(x) side", the selection unit 14 delivers, to the CRC calculation unit 15, data obtained by shifting the exclusive-OR of the data R(x) and B(x) by p bits toward a least significant side, that is produced by the first shifting unit 13.

The CRC calculation unit 15 executes the CRC computation of the integral multiple bits block A(x) of 'a(x) #1' to 'a(x) #(w−1)', produced by the selection unit 14, thereby producing R(x) as the CRC value of the integral multiple bits block A(x) (refer to the w-th word string shown in FIG. 4F).

Now, there will be described hereinafter a method whereby the CRC value {R(x)} of the integral multiple bits block A(x) is calculated by the CRC calculation unit 15. The CRC calculation unit 15 divides an (M−1)-order polynomial with respective bits of the data of the M bits in width, being used as factors, by an optionally generated d-order polynomial G(x), thereby calculating the remainder. The order d of the generated polynomial G(x) is pre-decided. Inasmuch as the bit length of the integral multiple bits block A(x) is an integral multiple {(w−1) times} of M, the CRC calculation unit 15 executes calculation for calculating the remainder in connection with the data of the M bits, as described above, starting from 'a(x) #1' as the first M bits of the integral multiple bits block A(x), up to 'a(x) #(w−1)', as the last M bits, respectively. Upon calculating the remainder for the first M bits 'a(x) #1', the CRC calculation unit 15 holds the remainder. Upon inputting of the next M bits 'a(x) #2', the CRC calculation unit 15 shifts data (d bits) expressing the remainder as held by (M−d) bits toward a most significant side, and calculates the exclusive-OR of the remainder and the next M bits 'a(x) #2', thereby calculating the remainder to be obtained when the (M−1)-order polynomial expressed by the exclusive-OR is divided by the generated polynomial G(x), whereupon the remainder is held. Then, the CRC calculation unit 15 repeats similar processing against the data of the M bits, succeeding thereafter. Respective bits of the data (d bits) expressing the remainder correspond to the factors of a (d−1)-order polynomial, and shifting by (M−d) toward the most significant side bits refers to shifting by (M−d) toward bits corresponding to high-order terms, respectively. Upon inputting of the last M bits 'a(x) #(w−1)', the CRC calculation unit 15 shifts data expressing the remainder as held by (M−d) bits toward a most significant side, and calculates exclusive-OR of the remainder and the last M bits 'a(x) #(w−1)', Then, the CRC calculation unit 15 calculates the remainder to be obtained when the (M−1)-order polynomial expressed by the exclusive-OR is divided by the generated polynomial G(x), thereby working out the remainder calculated as the CRC value {R(x)} of the integral multiple bits block A(x).

Specific explanation is described hereinafter with reference FIGS. 4E and 4F. With reference to the 'a(x) #1' of a first word of the integral multiple bits block A(x), the CRC calculation unit 15 divides the (M−1)-order polynomial with the respective bits of the 'a(x) #1', being used as the factors, by the generated polynomial G(x), thereby holding data expressing the remainder. 'R(x) #1' shown in FIG. 4F is the data as held. Following this, the CRC calculation unit 15 shifts the 'R(x) #1' as held by (M−d) bits toward a most significant side, and calculates exclusive-OR of the 'R(x) #1' and 'a(x) #2' of a second word of the integral multiple bits block A(x), dividing a polynomial with respective bits of the exclusive-OR, used as factors, by the generated polynomial G(x), thereby holding data expressing the remainder. 'R(x) #2' shown in FIG. 4F is the data as held. Similarly, the CRC calculation unit 15 shifts the 'R(x) #2' as held by (M−d) bits toward a most significant side, and calculates exclusive-OR of the 'R(x) #2' and 'a(x) #3' of a third word of the integral multiple bits block A(x), dividing a polynomial with respective bits of the exclusive-OR, used as factors, by the generated polynomial G(x), thereby holding data expressing the remainder. The CRC calculation unit 15 works out R(x) by executing such processing up to a (w−1)-th word. R(x) is the remainder obtained by dividing, by the generated polynomial G(x), a polynomial with respective bits of exclusive-OR of results of shifting 'R(x) #(W−2)' held upon execution of processing by (M−d) bits toward a most significant side and 'a(x) #(W−1)' of the (w−1)-th word, being used as factors.

A process for calculating R(x) by the processing described as above is shown hereinafter by formulas. It will be assumed that a data string consisting of the first word 'a(x) #1' and the second word 'a(x) #2' is designated as N1(x). Assuming that a CRC value of N1(x), 'R(x) #2', is to be calculated, N1(x) can be expressed by formula (14):

$$N1(x)=a(x)\#1 \cdot x^M + a(x)\#2 \qquad \text{formula (14)}$$

The CRC value of N1(x), 'R(x)#2', can be expressed by formula (15):

$$R(x)\#2=[N1(x) \cdot x^d] \bmod G(x) \qquad \text{formula (15)}$$

With the use of the formula (14), the formula (15) can be transformed into the following formula (16):

$$R(x)\#2=\{[a(x)\#1 \cdot x^M + a(x)\#2] \cdot x^d\} \bmod G(x) \qquad \text{formula (16)}$$

Further, the following formula (17) holds, and formula (18) can be introduced from the formulas (16) and (17). The formula (18) can be transformed into formula (19).

$$R(x)\#1=\{[a(x)\#1 \cdot x^d] \bmod G(x) \qquad \text{formula (17)}$$

$$R(x)\#2=\{R(x)\#1 \cdot x^M + a(x)\#2 \cdot x^d\} \bmod G(x) \qquad \text{formula (18)}$$

$$R(x)\#2=\{[R(x)\#1 \cdot x^{(M-d)} + a(x)\#2] \cdot x^d\} \bmod G(x) \qquad \text{formula (19)}$$

The formulas described as above show the process for calculating the remainder by division of the exclusive-OR of the results of shifting the data as held by (M−d) bits and the next M bits.

Further, with reference to 'b'(x)' produced by the selection unit 14, the CRC calculation unit 15 divides the (M−1)-order polynomial with the respective bits of the 'b'(x)', being used as factors, by the generated polynomial G(x), whereupon the remainder of division is designated as R'(x). In the case of calculating R'(x), bit shifting against data as held and computation of exclusive-OR are not executed.

The CRC calculation unit 15 delivers R(x) to the first exclusive-OR unit 12. Further, following the (w−1)-th word string, the computation controller 11 receives the final word valid data signal H(k) and a bit string b(x) containing the fraction bits block B(x) from the header impart unit 2-2 and delivers the bit string b(x) to the first exclusive-OR unit 12. Accordingly, the first exclusive-OR unit 12 is supplied with R(x) and the bit string containing the fraction bits block B(x).

Further, upon receiving the final word valid data signal H(k), the computation controller 11 delivers the data region select signal ABSEL indicative of "B(x) side" to the selection unit 14. Further, the computation controller 11 delivers the first piece of shift information p {p=M−H(k)} to the first shifting unit 13 and delivers the second piece of shift information q {q=H(k)} to the second shifting unit 16 (refer to FIGS. 4F to 4J).

The first exclusive-OR unit 12 computes the exclusive-OR of the fraction bits block B(x) and R(x) as the output {the CRC value of A(x)} of the CRC calculation unit 15 against the integral multiple bits block A(x). R(x) has a length of d bits.

Figure 5C:
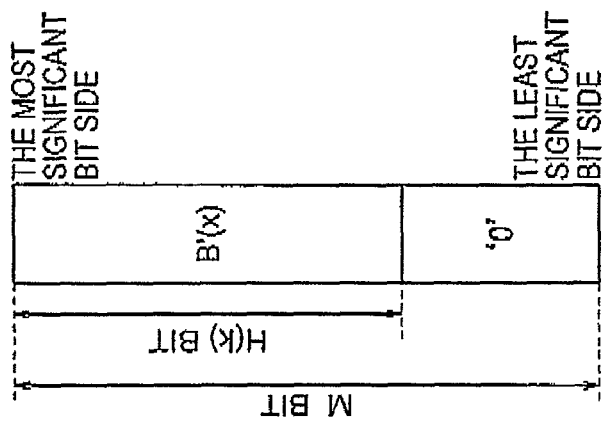
FIGS. 5A, 5B, and 5C are a schematic illustration showing computation for calculating exclusive-OR of R(x) and B(x)
Figure 5B:
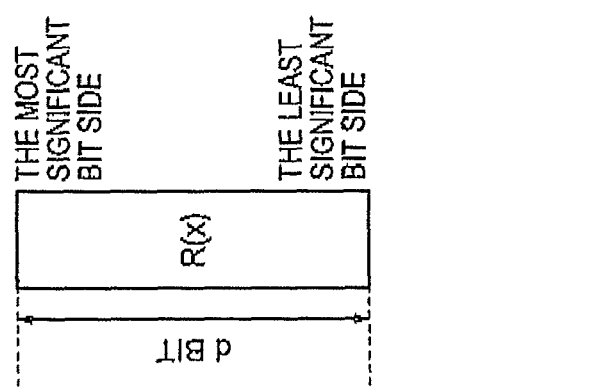
Figure 5A:
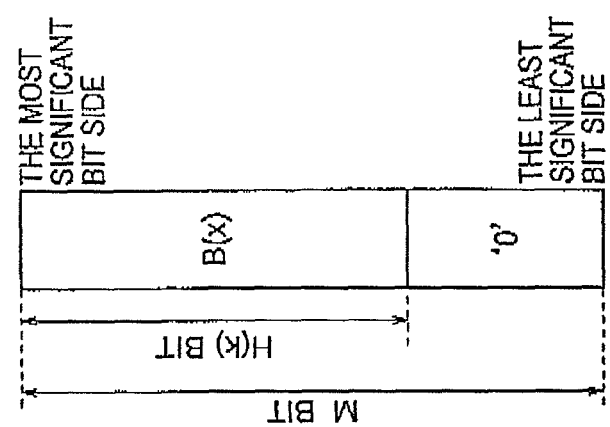

FIGS. 5A through 5C are a schematic illustration showing computation for calculating the exclusive-OR of R(x) and B(x). FIG. 5A shows the bit string b(x). The bit string b(x) contains the fraction bits block B(x) of H(k) bits in length. FIG. 5B shows the CRC calculation value R(x) of the integral multiple bits block A(x) shown in the w-th word string in FIG. 4F. The first exclusive-OR unit 12 delivers, to the first shifting unit 13, a data string (refer to FIG. 5C) of M bits in width, containing B'(x) {H(k) bits in length}, as computation results of the exclusive-OR of R(x) and B(x). It is sufficient for the first exclusive-OR unit 12 to align the most significant bits with each other to compute the exclusive-OR of R(x) and the data string of M bits in width, containing B(x), thereby calculating the data string of M bits in width, containing B'(x), to be delivered to the first shifting unit 13.

Figure 6A:
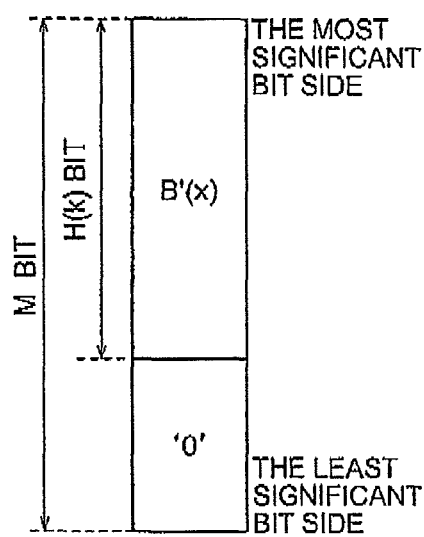
FIGS. 6A and 6B are a schematic illustration showing shift-processing by a first shifting unit.
Figure 6B:
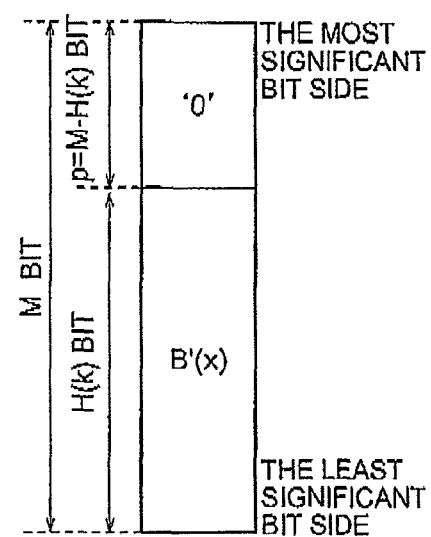

FIGS. 6A and 6B are a schematic illustration showing shift-processing by the first shifting unit 13. In order to enable the CRC calculation unit 15 with M bits supplied thereto to execute the CRC calculation of the B'(x) contained in the output (refer to FIG. 6A) of the first exclusive-OR unit 12, the first shifting unit 13 shifts the output data of the first exclusive-OR unit 12 toward the least significant bit by p bits in accordance with the first piece of shift information p {p=M−H(k)} from the computation controller 11. Further, the first shifting unit 13 sets '0' unaffecting the CRC calculation value to p bits on the most significant side, which data is lost due to shifting. A data string where there are executed the shift-processing and '0' setting to most significant p bits is denoted as b'(x). FIG. 6B shows the data string b'(x). The data string b'(x) has a bit length of M bits. The first shifting unit 13 delivers the data string b'(x) to the selection unit 14.

Inasmuch as the computation controller 11 causes the data region select signal ABSEL to indicate "B(x) side" at this point in time, the selection unit 14 delivers, to the CRC calculation unit 15, the data string b'(x) supplied from the first shifting unit 13 (refer to w column in FIG. 4E).

Figure 7:
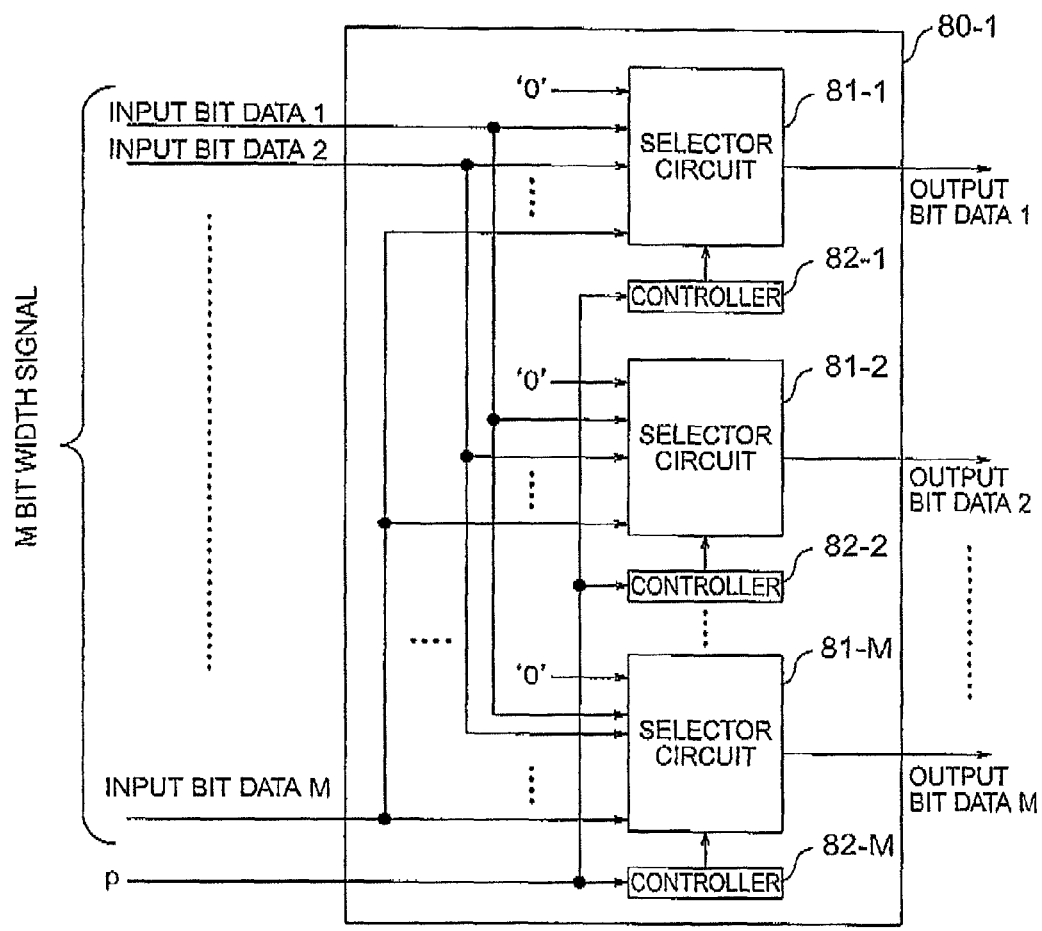
FIG. 7 is a block diagram showing a configuration of the first shifting unit by way of example.

FIG. 7 is a block diagram showing a configuration of the first shifting unit 13 by way of example. The first shifting unit 13 is provided with M sets of selector circuits and controllers. In FIG. 7, a first one to a M-th one of the selector circuits are denoted by reference numerals from '81-1' to '81-M', respectively. Similarly, a first one to a M-th one of the controllers are denoted by reference numerals '82-1' to '82-M', respectively. Each of the selector circuits 81-1 to 81-M is supplied with data of M bits and a value '0' of one bit. Respective bits of the data of M bits, from the most significant one to the least significant one, are denoted as an input bit data 1, . . . , and an input bit data M. Each of the selector circuits 81-1 to 81-M selects any of the input bit data 1, . . . , and an input bit data M, or '0' as supplied before producing the same. Output data produced by each of the selector circuits 81-1 to 81-M is data of one bit.

The respective sets of the selector circuit and the controller sequentially correspond to the respective bits from the most significant one to the least significant one. Then, the respective controllers 82-1 to 82-M produce a signal instructing the respective selector circuits paired off therewith to produce an input bit data more significant than the input bit data corresponding thereto by p bits, or instructing to produce '0' if the input bit data more significant than the input bit data corresponding thereto by p bits is not available. The respective selector circuits 81-1 to 81-M produce the data of one bit, according to the signal transmitted from each of the controllers.

A bit string made up of bits, each of the bits, being produced one by one from the respective selector circuits 81-1 to 81-M, becomes data after the shift-processing.

Next, there is described hereinafter an operation of the first shifting unit 13 by citing a specific example. It is assumed that M=3 and the first shifting unit 13 comprises first through third selector circuits 81-1 to 81-3 and first through third controllers 82-1 to 82-3. The bits of the data of d bits, supplied to the first shifting unit 13, ranging from the most significant one to the least significant one, are designated as an input bit data 1, . . . , and an input bit data 3, respectively. Further, bits produced by the first through the third selector circuits 81-1 to 81-3, respectively, are designated as an output bit data 1, . . . , and an output bit data 3, respectively. The output bit data 1 is most significant bit data after shifting while the output bit data 3 is least significant bit data after the shifting.

It is assumed that, for example, the first piece of shift information p=1, in which case, the operation is carried out as follows:

The first controller 82-1 delivers, to the first selector circuit 81-1, a signal for producing '0' on the basis of the first piece of shift information p=1. The first selector circuit 81-1 selects '0' in accordance with the signal from the first controller 82-1, thereby producing '0' as the output bit data 1.

The second controller 82-2 delivers, to the second selector circuit 81-2, a signal for producing the input bit data 1 on the basis of the first piece of shift information p=1. The second selector circuit 81-2 selects the input bit data 1 in accordance with the signal from the second controller 82-2, thereby producing the input bit data 1 as the output bit data 2.

The third controller 82-3 delivers, to the third selector circuit 81-3, a signal for producing the input bit data 2 on the basis of the first piece of shift information p=1. The third selector circuit 81-3 selects the input bit data 2 in accordance with the signal from the third controller 82-3, thereby producing the input bit data 2 as the output bit data 3.

As a result of the operation as above, the first shifting unit 13 produces '0' as the output bit data 1, the input bit data 1 as the output bit data 2, and the input bit data 2 as the output bit data 3. Thus, input data of 3 bits is shifted by one bit toward the least significant bit owing to the first piece of shift information p=1.

Further, it is assumed that, for example, the first piece of shift information p=2, in which case, the operation is carried out as follows:

The first controller 82-1 delivers, to the first selector circuit 81-1, a signal for producing '0' on the basis of the first piece of shift information p=2. The first selector circuit 81-1 selects '0' in accordance with the signal from the first controller 82-1, thereby producing '0' as the output bit data 1.

The second controller 82-2 delivers, to the second selector circuit 81-2, a signal for producing '0' on the basis of the first piece of shift information p=2. The second selector circuit 812 selects '0' in accordance with the signal from the second controller 82-2, thereby producing '0' as the output bit data 2.

The third controller 82-3 delivers, to the third selector circuit 81-3, a signal for producing the input bit data 1 on the basis of the first piece of shift information p=2. The third selector circuit 813 selects the input bit data 1 in accordance with the signal from the third controller 82-3, thereby producing the input bit data 1 as the output bit data 3.

As a result of the operation as above, the first shifting unit 13 produces '0' as the output bit data 1, '0' as the output bit data 2, and the input bit data 1 as the output bit data 3. Thus, the input data of 3 bits is shifted by two bits toward the least significant bit owing to the first piece of shift information p=2.

Herein, the case of M=3 is described by way of example, however, the same applies to the case of the M value being other than 3.

The CRC calculation unit 15 is a block where CRC calculation of M bits in width is executed. When the data region select signal ABSEL indicates "B(x) side", the CRC calculation unit 15 executes CRC calculation against the data string b'(x) {the data string containing B'(x) shifted by p bits toward the least significant bit} supplied from the selection unit 14 to produce a CRC value R'(x) of B'(x) {refer to (w+1) column in FIG. 4(f)}. As previously described, the CRC calculation unit 15 divides the (M−1)-order polynomial with the respective bits of the b'(x), being used as the factors, by the generated polynomial G(x), thereby designating the remainder thereof as R'(x).

Figure 8:
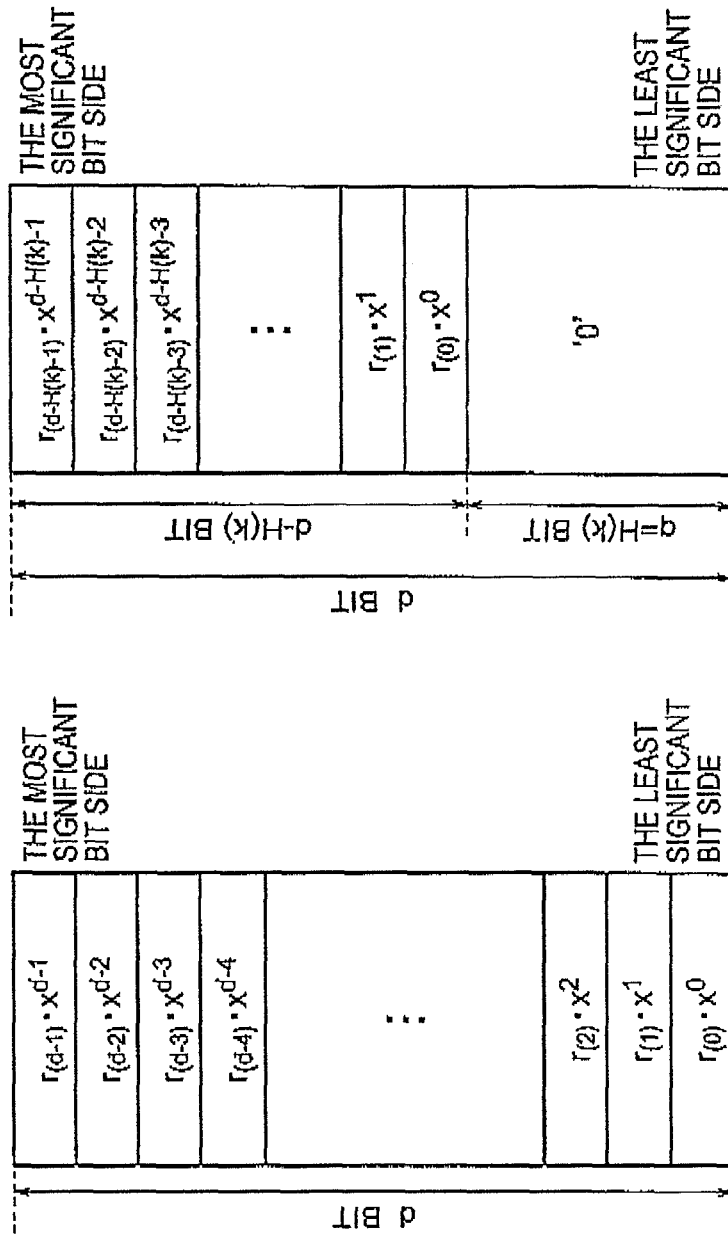
FIGS. 8A and 8B are a schematic illustration showing shift-processing by a second shifting unit.

FIGS. 8A and 8B are a schematic illustration showing shift-processing by the second shifting unit 16. The second shifting unit 16 is supplied with the second piece of shift information q {q=H(k)} from the computation controller 11 (refer to FIG. 4J). The second shifting unit 16 executes the shift-processing for shifting the output R(x) of the CRC calculation unit 15, against the integral multiple bits block A(x), by q bits toward the most significant bit, in accordance with the second piece of shift information q, as shown in FIG. 8B, thereby producing the data R"(x) of d bits in length. In FIG. 8A, the CRC value R(x) of the integral multiple bits block A(x) is shown by use of the formula (7). If the CRC value R(x) of the integral multiple bits block A(x) is shifted by q bits toward the most significant bit, according to the second piece of shift information q, there will be left out bits expressing a portion of the formula (7), from "$r_{(d-H(k)-1)} \cdot x^{d-H(k)-1}$" to "$r_{(0)} \cdot x^0$". The portion from "$r_{(d-H(k)-1)} \cdot x^{d-H(k)-1}$" to "$r_{(0)} \cdot x^0$" agrees with R 2(x) in the formula (8) and results of shifting at the second shifting unit 16 agree with R"(x) in the formula (11). Further, the second shifting unit 16 sets "0" to q bits on the least significant side, where data will be lost due to the shifting. The processing is a necessary processing for obtaining a portion of R(x), that is, the CRC calculation results of the CRC calculation unit 15, against the integral multiple bits block A(x) with the length corresponding to the integral multiple of M bits, otherwise deleted by the first shifting unit 13 in the case of "H(k)<d".

Figure 9:
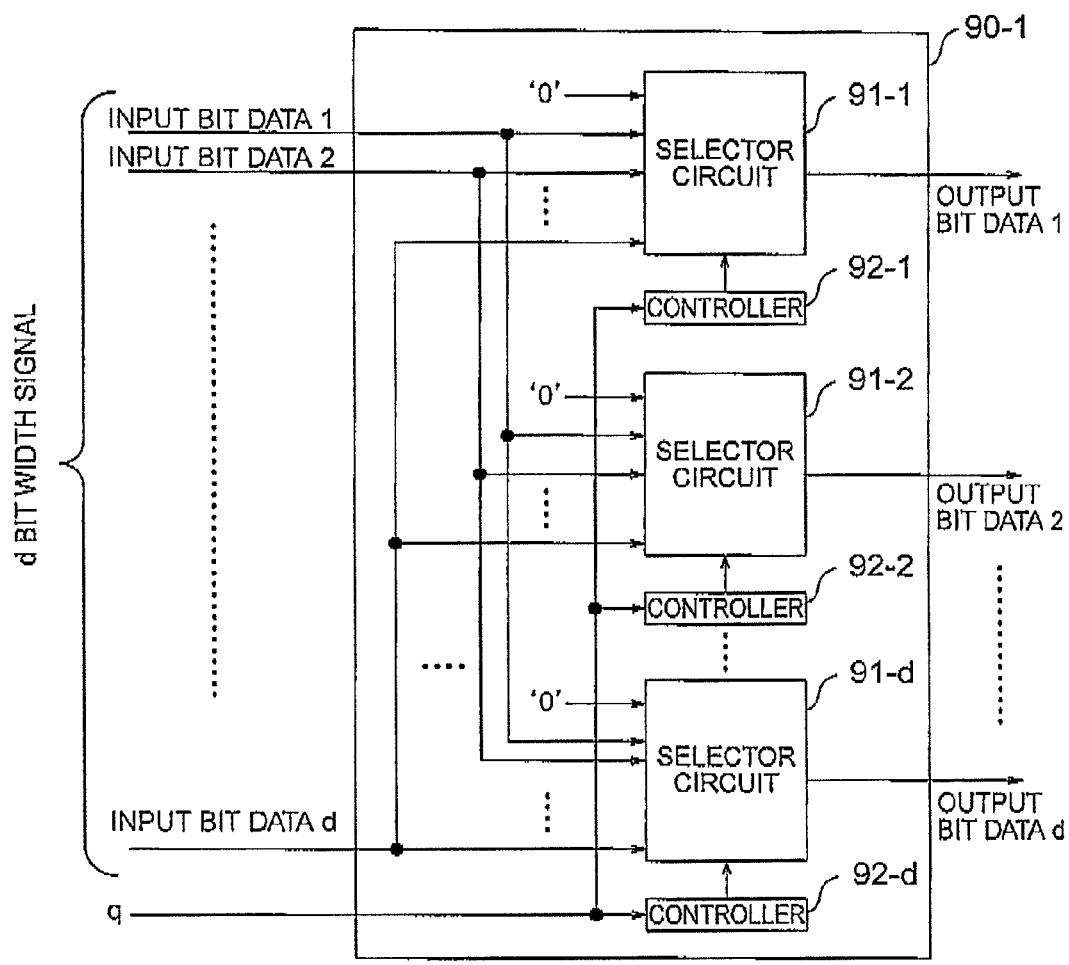
FIG. 9 is a block diagram showing a configuration of the second shifting unit by way of example.

FIG. 9 is a block diagram showing a configuration of the second shifting unit 16 by way of example. The second shifting unit 16 comprises d sets of selector circuits and controllers. In FIG. 9, a first one to a d-th one of the selector circuits are denoted by reference numerals '91-1' to '91-d', respectively. Similarly, the first one to the d-th one of the controllers are denoted by reference numerals '92-1' to '92-d', respectively. Each of the selector circuits 91-1 to 91-d is supplied with data of d bits and a value '0' of one bit. Respective bits of the data of d bits, from the most significant one to the least significant one, are denoted as an input bit data 1, . . . , and an input bit data d. The respective selector circuits 91-1 to 91-d select any of the input bit data 1, . . . , and an input bit data d, or '0' as supplied before producing the same. Output data produced by each of the selector circuits 91-1 to 91-d is data of one bit.

The respective sets of the selector circuit and the controller sequentially correspond to the respective bits from the most significant one to the least significant one. Then, the respective controllers 92-1 to 92-d produce a signal instructing the respective selector circuits paired off therewith to produce an input bit data less significant than the input bit data corresponding thereto by q bits, or instructing to produce '0' if the input bit data less significant than the input bit data corresponding thereto by q bits is not available. The respective selector circuits 91-1 to 91d produce the data of one bit, according to the signal sent from each of the controllers.

A bit string made up of bits, each of the bits, being produced one by one from the respective selector circuits 91-1 to 91-d, becomes data after the shift-processing.

Next, there is described hereinafter an operation of the second shifting unit 16 by citing a specific example. Herein, it is assumed that d=3 and the second shifting unit 16 comprises first through third selector circuits 91-1 to 91-3 and first through third controllers 92-1 to 92-3. The bits of the data of d bits, supplied to the second shifting unit 16, ranging from the most significant one to the least significant one, are designated as an input bit data 1, . . . , and an input bit data 3, respectively. Further, bits produced by the first through the third selector circuits 91-1 to 91-3, respectively, are designated as an output bit data 1, . . . , and an output bit data 3, respectively. The output bit data 1 is most significant bit data after shifting while the output bit data 3 is least significant bit data after the shifting.

It is assumed that, for example, the second piece of shift information q=1, in which case, the operation is carried out as follows:

The first controller 92-1 delivers, to the first selector circuit 91-1, a signal for producing the input bit data 2 on the basis of the second piece of shift information q=1. The second selector circuit 91-1 selects the input bit data 2 in accordance with the signal from the first controller 92-1 to produce the input bit data 2 as the output bit data 1.

The second controller 92-2 delivers, to the second selector circuit 91-2, a signal for producing the input bit data 3 on the basis of the second piece of shift information q=1. The second selector circuit 91-2 selects the input bit data 3 in accordance with the signal from the second controller 92-2 to produce the input bit data 3 as the output bit data 2.

The third controller 92-3 delivers, to the third selector circuit 91-3, a signal for producing "0" on the basis of the second piece of shift information q=1. The third selector circuit 91-3 selects "0" in accordance with the signal from the third controller 92-3 to produce "0" as the output bit data 3.

As a result of the operation as above, the second shift unit 16 produces the input bit data 2 as the output bit data 1, the input bit data 3 as the output bit data 2, and "0" as the output bit data 3. Thus, the input data of 3 bits is shifted by one bit toward the most significant bit owing to the second piece of shift information q=1.

Further, it is assumed that, for example, the second piece of shift information q=2, in which case, the operation is carried out as follows:

The first controller 92-1 delivers, to the selector circuit 91-1, a signal for producing the input bit data 3 on the basis of the second piece of shift information q=2. The first selector circuit 91-1 selects the input bit data 3 in accordance with the signal from the first controller 92-1 to produce the input bit data 3 as the output bit data 1.

The second controller 92-2 delivers, to the second selector circuit 91-2, a signal for producing '0' on the basis of the second piece of shift information q=2. The second selector circuit 91-2 selects '0' in accordance with the signal from the second controller 92-2 to produce '0' as the output bit data 2.

The third controller 92-3 delivers, to the third selector circuit 91-3, a signal for producing "0" on the basis of the second piece of shift information q=2. The third selector circuit 91-3 selects "0" in accordance with the signal from the third controller 92-3 to produce "0" as the output bit data 3.

As a result of the operation as above, the second shift unit 16 produces the input bit data 3 as the output bit data 1, '0' as the output bit data 2, and '0' as the output bit data 3. Thus, the input data of 3 bits is shifted by two bits toward the most significant bit owing to the second piece of shift information q=2.

The second exclusive-OR unit 17 executes computation of the exclusive-OR of the output R"(x) of the second shifting unit 16 and the output R'(x) of the CRC calculation unit 15 against the output B'(x) of the first shifting unit 13. The output R"(x) of the second shift unit 16 represents data obtained by shifting the CRC value R(x) of the integral multiple bits block A(x) by q bits toward the most significant bit. Further, the output R'(x) of the CRC calculation unit 15 against the output B'(x) represents data obtained by shifting the exclusive-OR of the fraction bits block B(x) and the R(x) by p bits toward the least significant bit.

The exclusive-OR of R'''(x) and R'(x), computed by the second exclusive-OR unit 17, is a CRC value for a frame supplied to the parallel CRC processing unit 2-3. The second exclusive-OR unit 17 delivers, to the FCS impart unit 2-4, the CRC value obtained by computing exclusive-OR of R'''(x) and R'(x) together with the frame (the input frame) M bits in width, SOF, and H(k).

The constituent elements (the computation controller 11, the first exclusive-OR unit 12, the first shifting unit 13, the selection unit 14, the CRC calculation unit 15, the second shifting unit 16, and the second exclusive-OR unit 17) of the parallel CRC processing unit 2-3 (the parallel cyclic code generation device) may be each an individual circuit. Further, the respective constituent elements of the parallel CRC processing unit 2-3 may be implemented by a CPU to be operated in accordance with a program for generation of a parallel cyclic code. For example, the CPU may be enabled to read the program for generation of the parallel cyclic code, pre-stored in a memory, to be thereby operated as the computation controller 11, the first exclusive-OR unit 12, the first shifting unit 13, the selection unit 14, the CRC calculation unit 15, the second shifting unit 16, and the second exclusive-OR unit 17, respectively, in accordance with the program for generation of the parallel cyclic code.

Now, there will be described hereinafter effects of the present embodiment of the invention.

With the present embodiment, the first exclusive-OR unit 12 computes an exclusive-OR of the fraction bits block and the CRC value of the integral multiple bits block with bits corresponding to an integral multiple of M bits in the input frame, and the first shifting unit 13 shifts the exclusive-OR by p {p=M−H(k)} bits toward the least significant bit. Then, the CRC calculation unit 15 calculates the CRC value R'(x) of the data after such shifting. Further, the second shifting unit 16 shifts the CRC value of the integral multiple bits block with the length corresponding to the integral multiple of M of an input frame variable in length by q bits toward the most significant side, and the second exclusive-OR unit 17 executes computation of the exclusive-OR of data thus obtained and R'(x), thereby calculating the CRC value of the input frame. As a result of such calculation described as above, it is possible to calculate the CRC value of the input frame without execution of buffering for calculating a frame length regardless of the frame length of the input frame. As a result, it is possible to prevent occurrence of delay in parallel CRC code computation processing, and an increase in circuit size, so that constraints on a broader band can be eased.

Upon comparing the configuration shown in FIG. 18 with that according to the present invention, it has been found that in the case of the configuration shown in FIG. 18, buffering of data corresponding to at least one frame, or more is required, and to that extent, processing delay has increased. With the present invention, a CRC value can be generated with processing delay corresponding to several clocks only. If the present invention is applied to a communications technology, in regions of a server product, and a high-performance computing product, with importance attached to delay characteristics thereof, particularly to a network interface card, this will enable generation of an ultra-low delay CRC.

Further, with the present invention, inasmuch as there is no need for buffering, it is unnecessary to provide constituent elements for the purpose of the buffering, so that a circuit size can be reduced. Hence, it is possible to miniaturize communications equipment such as a router, LAN switching devices, and so forth, a server product, and a high-performance computing product. Furthermore, inasmuch as no buffering is required, it will be possible to implement a communications technology with an expanded frame length, which is likely to substitute for Ethernet in future.

In the description given as above, there is shown the case where the parallel CRC processing unit 2-3 (the parallel cyclic code generation device) calculates the CPC value of the frame by execution of shifting on a bit-by-bit basis, however, a shift amount in the shift-processing need not be in units one bit. The computation controller 11 may generate the first piece of shift information p, and the second piece of shift information q, expressed in units of plural bits such as a byte, and so forth, and each of the first shifting unit 13 and the second shifting unit 16 may execute the shift-processing in units of the plural bits.

Further, the embodiment described in the foregoing has been described by taking the case where the parallel CRC processing unit 2-3 executes the parallel CRC code computation in order to find the CRC code (CRC value) as an example, however, the present invention may be also applicable to generation of the cyclic codes other than the CRC code, such as a hamming code, BCH code, and so forth, calculated by dividing an input information string by the generated polynomial G(x). In such a case, it need only be sufficient to have means for calculating other cyclic codes (the hamming code, BCH code, and so forth) as a substitute for the CRC calculation unit 15 used for calculation of the CRC value. Even if a cyclic code other than the CRC value is computed, it is possible to gain the advantageous effect of dispensing with the buffering for calculating the bit length of an input frame, so that occurrence of the delay, and an increase in circuit size can be prevented, thereby easing constraints imposed on a broader band.

Exemplary Embodiment 2

Figure 10:
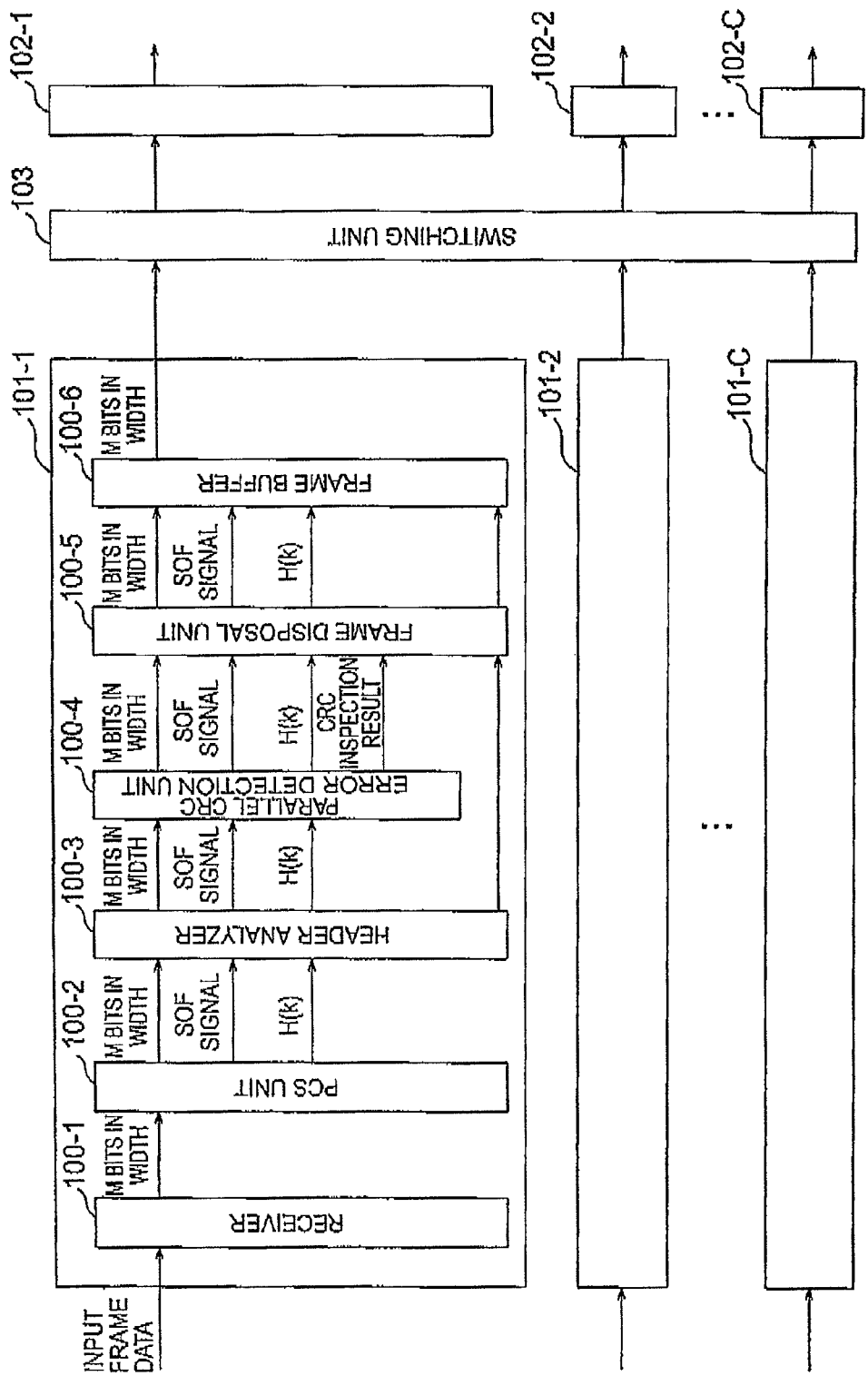
FIG. 10 is a block diagram showing an example of a configuration of an Ethernet switch to which the present invention is applied.

A second exemplary embodiment of the invention illustrates a parallel cyclic code error detection device for executing computation in order to inspect parallel cyclic codes. FIG. 10 is a block diagram showing an example of a configuration of an Ethernet switch to which the present invention is applied. The Ethernet switch illustrated in FIG. 10 comprises line card receivers 101-1 to 101-C, a switching unit 103, and line card transmitters 102-1 to 102-C. One line card receiver is paired off with one line card transmitter, and the number of the line card receiver and line card transmitter, in pairs, is denoted by C, where C represents an optional positive integer not less than 1. In FIG. 10, respective pairs of the line card receiver and line card transmitter are denoted by a number after hyphen in each of reference numerals '101-1' to '101-C', indicating the respective line card receivers. The same applied to reference numerals '102-1' to '102-C', indicating the respective line card transmitters. The line card receiver and line card transmitter, in an optional pair, are denoted by reference numerals '101c', and '102-c', respectively. Provided, however, that c is a positive integer not less than 1 and not more than C. The line card receiver '101-c' and the line card transmitter '102-c', to pair off with each other, are mounted, for example, as one line card. And C pieces of the line cards each are present at every port, and are connected to the switching unit 103.

The respective line card receivers '101-1' to '101-C' execute receipt of a frame, analysis thereof, inspection thereof, and disposal thereof, thereby transferring a transferable frame to the switching unit 103. By taking the line card receiver 101-1 as an example, an operation as well as a configuration thereof is described hereinafter. The same applies to the operation as well as the configuration of any of other line card receivers.

The line card receiver 101-1 comprises a receiver 100-1, a PCS unit 100-2, a header analyzer 100-3, a parallel CRC error detection unit 100-4, a frame disposal unit 100-5, and a frame buffer 100-6.

The receiver 100-1 is connected to the PCS unit 100-2 within the line card receiver 101-1. Upon receiving of a frame from outside, the receiver 100-1 converts the frame from serial data into parallel data to be subsequently delivered to the PCS unit 100-2.

The PCS unit 100-2 is connected to the receiver 100-1 and the header analyzer 100-3. The PCS unit 100-2 decodes the frame encoded by 8B/10B code, and 64B/66B code, thereby delivering the frame of M bits in width to the header analyzer 100-3. If, for example, 10 Gigabit Ethernet is adopted, the frame is decoded by the 64B/66B code. Further, the PCS unit 100-2 generates the SOF signal indicative of the head of the frame and the final word valid data signal H(k) indicative of the trailer of the frame to be delivered, together with the frame of M Bits in width, to the header analyzer 100-3. The PCS unit 100-2 produces the SOF signal at the time of, for example, producing first M bits of the frame. The PCS unit 1002 produces the bit numbers of the fraction bits block B(x) as the final word valid data signal H(k) at the time of, for example, producing the fraction bits block B(x) at the trailer of the frame.

The header analyzer 100-3 is connected to the PCS unit 100-2, the parallel CRC error detection unit 100-4, and the frame disposal unit 100-5. The header analyzer 100-3 analyzes the content of the header of the frame supplied from the PCS unit 100-2 to produce frame control information. Further, the header analyzer 100-3 delivers the frame to the parallel CRC error detection unit 1004. At this point in time, the header analyzer 100-3 produces the SOF signal at the time of, for example, producing the first M bits of the frame, and produces the bit numbers of the fraction bits block B(x) as the final word valid data signal H(k) at the time of producing the fraction bits block B(x) at the trailer of the frame.

The parallel CRC error detection unit 1004 is connected to the header analyzer 100-3 and the frame disposal unit 100-5. The parallel CRC error detection unit 100-4 executes CRC computation in a range from the header of the frame to the frame FCS for detection of an error in the frame. Then, the parallel CRC error detection unit 100-4 delivers CRC error detection results (results of error detection) to the frame disposal unit 100-5.

The frame disposal unit 100-5 is connected to the header analyzer 100-3, the parallel CRC error detection unit 100-4, and the frame buffer 100-6. The frame disposal unit 100-5 disposes the frame supplied from the parallel CRC error detection unit 100-4 according to frame control information from the header analyzer 100-3 and the CRC error detection results from the parallel CRC error detection unit 100-4. Further, the frame disposal unit 100-5 delivers, to frame buffer 100-6, a frame the CRC error detection results of which turn out normal and the control information of the frame.

The frame buffer 100-6 is connected to the frame disposal unit 100-5 and the switching unit 103. The frame buffer 100-6 executes buffering of the frame to be transmitted to the switching unit 103 together with the control information of the frame.

The switching unit 103 transfers the frame supplied from the line card receiver 101-1 to the line card transmitter 102-1 paired off with the line card receiver 101-1 in accordance with the control information of the frame.

The line card transmitter 102-1 converts the frame transferred from the switching unit 103 into serial data to be subsequently transmitted. The same applies to the other line card transmitters.

Figure 11:
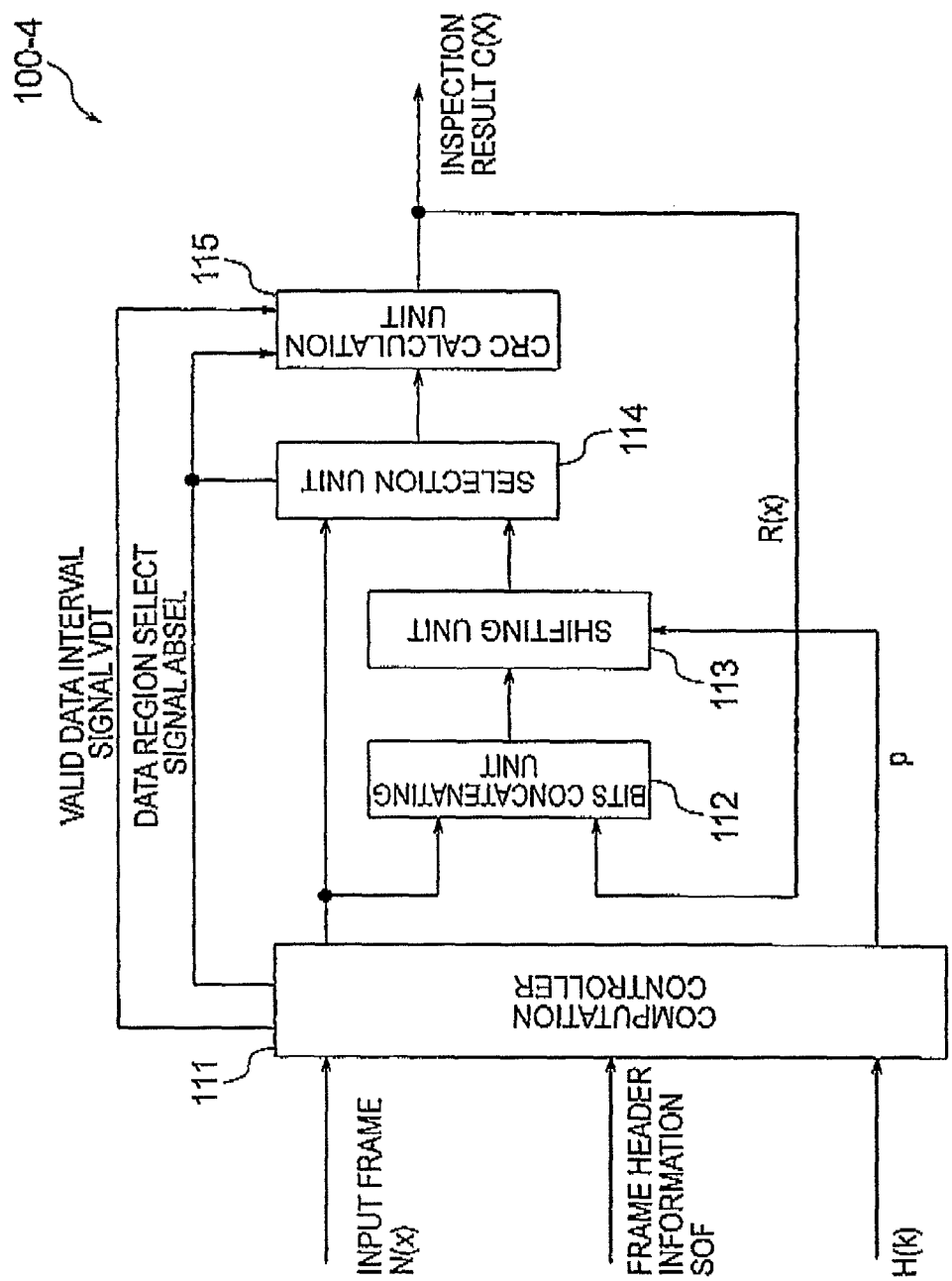
FIG. 11 is a block diagram showing a parallel CRC error detection unit (a parallel cyclic code error detection device) according to a second embodiment of the invention.

The parallel CRC error detection unit 100-4 is the parallel cyclic code error detection device according to the invention. FIG. 11 is a block diagram showing the parallel CRC error detection unit 100-4 according to the second exemplary embodiment of the invention. Referring to FIG. 11, the parallel CRC error detection unit 100-4 will be described hereinafter.

The parallel CRC error detection unit 100-4 executes an error inspection against the input frame (containing a FCS value) of M bits in width. The FCS value is a cyclic code, and a bit length of the frame containing the FCS value is optional. If a frame length of the input frame is not an integral multiple of a parallel width M bits, the parallel CRC error detection unit 100-4 detects the integral multiple bits block A(x), the fraction bits block B(x), and the length H(k) of the fraction bits block, further generates the valid data interval signal VDT of input data.

The parallel CRC error detection unit 100-4 concatenates a CRC computation result R(x) of the integral multiple bits block A(x) with the most significant bit of the fraction bits block B(x).

The parallel CRC error detection unit 100-4 shifts the concatenated data by p {p=M−H(k)} bits toward the least significant bit. The concatenated data B"(x) concatenated R(x) with B(x) has a length M−H(k), and this shift-processing is executed in order to carry out CRC computation of B"(x) by a CRC calculation unit with the input of M bits in width.

The parallel CRC error detection unit 100-4 executes the CRC computation by use of the CRC calculation unit.

Further, the parallel CRC error detection unit 100-4 executes changeover between results of the shift-processing and the integral multiple bits block A(x) before supplying it to the CRC calculation unit.

A configuration of the parallel CRC error detection unit 100-4 will be specifically described hereinafter. As shown in FIG. 11, the parallel CRC error detection unit 100-4 comprises a computation controller 111, a bits concatenating unit 112, a shifting unit 113, a selection unit 114, and the CRC calculation unit 115.

The computation controller 111 discriminates the integral multiple bits block A(x) and the fraction bits block B(x) with reference to a frame as an object of the CRC error detection, parallelized so as to be M bits in width, thereby delivering the same to the bits concatenating unit 112 and the selection unit 114.

Further, the computation controller 111 is supplied with H(k) indicative of the length of the fraction bits block B(x), whereupon the computation controller 111 detects a value of the H(k). Further, the computation controller 111 generates shift information p indicative of a shift amount in bits and delivers the shift information p to the shifting unit 113. It need only be sufficient for the computation controller 111 to calculate M−H(k) to thereby generate the shift information p.

Still further, the computation controller 111 generates a valid data interval signal VDT indicating that a bit string belonging to the frame is being supplied, and delivers the valid data interval signal VDT to the CRC calculation unit 115 during inputting of the bit string of the frame ({that is, during a time period from inputting of SOF to inputting of H(k)}.

Yet further, as with the case of the computation controller 11 according to the first embodiment, the computation controller 111 delivers, to the selection unit 114 and the CRC calculation unit 115, a data region select signal ABSEL indicating which of the integral multiple bits block A(x) and the fraction bits block B(x) is being produced.

If the frame length of the input frame is an integral multiple of M bits, the computation controller 111 produces the integral multiple bits block A(x) only, but does not produce the fraction bits block B(x).

It need only be sufficient for the computation controller 111 to execute processing described as above as in the case of the computation controller 11 according to the first embodiment.

The bits concatenating unit 112 concatenates the CRC value R(x) of the integral multiple bits block A(x), calculated by the CRC calculation unit 115, with the most significant bit of the fraction bits block B(x).

In order to cause the CRC calculation unit 115 of (d+M) bits in width to process the concatenated data, concatenated by the bits concatenating unit 112, the shifting unit 113 shifts the concatenated data by p {p=M−H(k)} bits toward the least significant bit. The shifting unit 113 sets "0" to p bits on the most significant side, where data will be lost as a result of shifting. The shifting unit 113 delivers results of shift-processing to the selection unit 114. Inasmuch as the computation results of the CRC value does not undergo a change due to "0" as set in the shift-processing, an object of the computation by the CRC calculation unit 115 will be (d+H(k)) bits.

The selection unit 114 executes processing for switchover between the integral multiple bits block A(x) with a length corresponding to the integral multiple of M bits of the input frame and an output of the shifting unit 113 in accordance with the data region select signal ABSEL generated by the computation controller 111. More specifically, when the data region select signal ABSEL indicates producing of the integral multiple bits block A(x), the selection unit 114 delivers the integral multiple bits block A(x) to the CRC calculation unit 115. When the data region select signal ABSEL indicates producing of the fraction bits block B(x), the selection unit 114 delivers output data of the shifting unit 113 to the CRC calculation unit 115. In the case where the input frame length is an integral multiple of M, the fraction bits do not exist, so that the output of the shifting unit 113 will not be selected.

The CRC calculation unit 115 executes CRC calculation against the data (d+M) bits in width which is produced by the selection unit 114. For the present CRC calculation unit, use is made of a CRC calculation circuit which does not include a circuit for multiplication of $x^d$. If, for example, CRC-32 is applied to the present CRC calculation unit, use can be made of a circuit obtained by modifying the CRC calculation circuit for serial data, as shown in FIG. 4 of Patent Document 1, so as to be (d+M) bits in width. When use is made of the CRC calculation circuit described as above, results of CRC calculation indicate "0" if there is no error in the frame in the case where a frame from the header up to the FCS is an object of the CRC calculation while the results of the CRC calculation indicate a value other than "0" if there is an error in the frame.

Now, there are described hereinafter respective operations of Ethernet switch shown in FIG. 10 and the parallel CRC error detection unit 100-4 (the parallel cyclic code error detection device) shown in FIG. 11.

FIGS. 12A through 12D show respective timing charts of frames which are supplied to the PCS unit 100-2, and respective timing charts of the frames and the signals which are produced by the PCS unit 100-2. FIG. 12A shows the frames supplied to the PCS unit 100-2. FIGS. 12B, 12C, and 12D show the frames, SOF, and H(k) which are delivered to the header analyzer 100-3 by the PCS unit 100-2, respectively.

Upon receiving the frame, the receiver 100-1 (refer to FIG. 10) executes serial-to-parallel conversion against the frame to deliver the frame after the conversion to the PCS unit 100-2. FIG. 12A shows the frames described. The PCS unit 100-2 decodes the frame supplied from the receiver 100-1. Then, the PCS unit 100-2 generates SOF information indicative of the head of the frame and the final word valid data signal H(k) indicative of the trailer of the frame to be delivered, together with the frame of M bits in width, to the header analyzer 100-3 (refer to FIGS. 12B, 12C, and 12D). The PCS unit 100-2 produces the SOF signal at the time of producing the first M bits of the frame. The PCS unit 100-2 produces the bit numbers of the fraction bits block B(x) as the final word valid data signal H(k) at the time of producing the fraction bits block B(x) at the trailer of the frame.

In the frame supplied to the PCS unit 100-2, there exist marks "/s/" (a frame-start delimiter) at the tip of the header, "/t/" (a frame-end delimiter) at the end of the frame, and IFG (Inter Frame Gap: inter-frame interval) between the frames. The PCS unit 100-2 substitutes "0" for each of those marks "/s/" (the frame-start delimiter), "/t/" (the frame-end delimiter), and IFG, thereby delivering the frame after processing to the header analyzer 100-3. As a result, frame-start delimiters 120-1, 120-3, and frame-end delimiters 120-2, 120-4, and IFG becomes invalid data as FIG. 12B.

The header analyzer 100-3 analyzes the header of the frame to thereby generate frame data control information, delivering the frame data control information to the frame disposal unit 100-5. Further, the header analyzer 100-3 delivers, to the parallel CRC error detection unit 100-4, the frame, the SOF signal, and the H(k) signal which are supplied from the PCS unit 100-2. The header analyzer 100-3 produces the SOF signal at the time of producing the first M bits of the frame. The header analyzer 100-3 produces the bit number of the fraction bits block B(x) as the final word valid data signal H(k) at the time of producing the fraction bits block B(x) at the trailer of the frame.

The parallel CRC error detection unit 100-4 calculates respective CRC values of the header to FCS of a frame supplied (a frame as an object of inspection), according to the SOF signal and the H(k) signal which are supplied from the header analyzer 100-3, thereby delivering the CRC values as CRC error detection results to the frame disposal unit 100-5.

The frame disposal unit 100-5 executes disposal of the frame in accordance with the frame data control information supplied from the header analyzer 100-3 and the CRC error detection results supplied from the parallel CRC error detection unit 100-4. Further, the frame disposal unit 100-5 delivers, to the frame buffer 100-6, a frame of which the CRC error detection results are calculated normal, together with the frame data control information.

Upon inputting of the frame from the frame disposal unit 100-5, the frame buffer 100-6 executes buffering of the frame together with the frame data control information. After the buffering, the frame buffer 100-6 delivers the frame and the frame data control information to the switching unit 103.

The switching unit 103 transfers the frame supplied from the frame buffer 100-6 to the line card transmitter in accordance with the frame data control information. The switching unit 103 transfers the frame to the line card transmitter 102-1 paired off with the line card receiver 101-1 having produced the frame to the switching unit 103.

The line card transmitter 102-1 converts frame data transferred from the switching unit 103 into serial data to be transmitted.

Next, an operation of the parallel CRC error detection unit 100-4 is described hereinafter. FIGS. 13A through 13I are a timing chart showing inputs and outputs of respective constituent elements of the parallel CRC error detection unit 100-4. FIGS. 13A, 13B, and 13C indicate SOF, H(k), and a frame which are supplied to the computation controller 111, respectively. Further, FIG. 13D indicates the frame supplied to the computation controller 111 in units of the word (string). Each of the words is M bits. FIGS. 13E and 13F indicate the output of the selection unit 114 and the output of the CRC calculation unit 115, respectively. The words produced by the selection unit 114 in FIG. 13E are (d+M) bits. FIGS. 13G to 13I indicate VDT, ABSEL, and the shift information p, respectively.

As shown in FIGS. 13A to 13D, respectively, the computation controller 111 is supplied from the header analyzer 100-3 with the frame of M bits in width as the object of the CRC error detection, the SOF signal indicative of the head of the frame, and the final word valid data signal H(k) indicative of the trailer of the frame. The computation controller 111 is supplied with the bit number of the friction bits block B(x) as the final word valid data signal H(k). In the exemplary embodiment, an FCS field is included in the friction bits block B(x) (refer to FIG. 13C) that is different from the first exemplary embodiment.

If the bit length of the frame inputted to the computation controller 111 is not an integral multiple of the parallel width M bits, the frame contains the integral multiple bits block A(x) with the length corresponding to the integral multiple of M bits and the fraction bits block B(x) with the bit length H(k). Data {'a(x) #1' to 'a(x) #(w−1)'}, corresponding to a first word string to a (w−1)-th word string, respectively, in whole, represent the integral multiple bits block A(x). Further, each of the data {'a(x) #1' to 'a(x) #(w−1)'} of the respective word strings of A(x) is a data string of M bits in width, and '#1' to '#(w−1)' each represent a word string number within the data of the frame. Still further, data 'b(x)' of a w-th word string is a bit string containing the fraction bits block B(x).

As shown in FIGS. 13A to 13D, respectively, upon inputting of the frame and the signals (SOF, H(k)), the computation controller 111 delivers, to the CRC calculation unit 115, the valid data interval signal VDT in a state indicating "valid (the bit string belonging to the frame is being inputted)" during a time period from the input of SOF to the input of H(k) (refer to FIG. 13G). In FIG. 13G, a 'H' (high) level indicates valid while an 'L' (low) level indicates invalid (the bit string belonging to the frame is not being supplied).

Further, the computation controller 111 delivers, to the selection unit 114 and the bits concatenating unit 112, the integral multiple bits block A(x) and the fraction bits block B(x) which are contained in the input frame. Still further, the computation controller 111 delivers the data region select signal ABSEL indicative of "A(x) side" to the selection unit 114 and the CRC calculation unit 115 during a time period over which the respective data strings of the word strings ranging from the first word string to the (w−1)-th word string, constituting the integral multiple bits block A(x), are supplied to be then produced. While the bit strings containing the fraction bits block B(x) are supplied to be then produced, the computation controller 111 delivers the data region select signal ABSEL indicative of "B(x) side" to the selection unit 114 and the CRC calculation unit 115. In FIG. 13(h), an 'H' (high) level indicates "A(x) side" while an 'L' (low) level indicates "B(x) side".

In accordance with the data region select signal ABSEL shown in FIG. 13H, the selection unit 114 delivers, to the CRC calculation unit 115, the data 'a'(x) #1' to 'a'(x) #(w−1)' that is concatenated 0 data of d bits long with the most significant bit side of the data 'a(x) #1' to 'a(x) #(w−1)' when the data region select signal ABSEL indicates "A(x) side". The data 'a'(x) #1' to 'a'(x) #(w−1)' of respective word strings from the first word string to the (w−1)-th word string are supplied from the computation controller 111. When the data region select signal ABSEL indicates "the B(x) side", the selection unit 114 delivers, to the CRC calculation unit 115, the data obtained by shifting the data concatenated the data R(x) with B(x) by p bits toward a least significant side that is produced by the shifting unit 113.

The CRC calculation unit 115 executes the CRC computation of the data 'a'(x) #1' to 'a'(x) #(w−1)' including the integral multiple bits block A(x) which is produced by the selection unit 114, to produce R(x) as the CRC value of the integral multiple bits block A(x) (refer to the w-th word string shown in FIG. 13F).

The CRC calculation unit 115 divides a (d+M−1)-order polynomial with respective bits of the data of the (d+M) bits in width, using as factors, by an optional d-order generated polynomial G(x), thereby calculating the remainder. The order d of the generated polynomial G(x) is pre-decided. Different in the case of the CRC calculation unit 15 according to the first exemplary embodiment, the CRC calculation unit 115 repeats processing for calculating exclusive-OR of results of shifting the date as held by M bits toward a most significant side and the next (d+M) bits, and holding the remainder obtained by division of the exclusive-OR, thereby working out R(x). More specifically, upon calculating the remainder for the first (d+M) bits of the frame, 'a'(x) #1', by the division as above, the CRC calculation unit 115 holds the remainder. Upon inputting of the next (d+M) bits 'a'(x) #2', the CRC calculation unit 115 shifts the data (d bits) expressing the remainder as held by M bits toward a most significant side, and calculates the exclusive-OR of the remainder and the next (d+M) bits 'a'(x) #2', thereby calculating the remainder to be obtained when the (d+M−1)-order polynomial expressed by the exclusive-OR is divided by the generated polynomial G(x), whereupon the remainder is held. Then, the CRC calculation unit 115 repeats similar processing against the data of the (d+M) bits, succeeding thereafter. Respective bits of the data (d bits) expressing the remainder correspond to the factors of a (d−1)-order polynomial, and shifting by M bits toward the most significant side bits refers to shifting by M bits toward bits corresponding to high-order terms, respectively. Upon inputting of the last (d+M) bits 'a'(x) #(w−1)', the CRC calculation unit 115 shifts the data expressing the remainder as held by M bits toward a most significant side, and calculates exclusive-OR of the remainder and the last (d+M) bits 'a'(x) #(w−1)'. Then, the CRC calculation unit 115 calculates the remainder to be obtained when the (d+M−1)-order polynomial expressed by the exclusive-OR is divided by the generated polynomial G(x), thereby working out the remainder calculated as the CRC value {R(x)} of the integral multiple bits block A(x).

Referring to FIGS. 13E and 13F, specific explanation will be described hereinafter. With reference to 'a'(x) #1' including a first word of the integral multiple bits block A(x), the CRC calculation unit 115 divides the (d+M−1)-order polynomial with the respective bits of the 'a'(x) #1' being used as the factors, by the generated polynomial G(x), thereby holding data expressing the remainder, 'R(x) #1' shown in FIG. 13F is the data as held. Following this, the CRC calculation unit 115 shifts the 'R(x) #1' as held by M bits toward a most significant side, and calculates exclusive-OR of 'R(x) #1' and 'a'(x) #2' including a second word of the integral multiple bits block A(x), dividing a polynomial with respective bits of the exclusive-OR, used as factors, by the generated polynomial G(x), thereby holding data expressing the remainder. 'R(x) #2' shown in FIG. 13F is the data as held. Similarly, the CRC calculation unit 115 shifts the 'R(x) #2' as held by M bits toward a most significant side, and calculates exclusive-OR of the 'R(x) #2' and 'a'(x) #3' including a third word of the integral multiple bits block A(x), dividing a polynomial with respective bits of the exclusive-OR, used as factors, by the generated polynomial G(x), thereby holding data expressing the remainder. The CRC calculation unit 115 works out R(x) by executing such processing up to a (w−1)-th word. R(x) is the remainder obtained by dividing, by the generated polynomial G(x), a polynomial with respective bits of exclusive-OR of results of shifting 'R(x) #(W−2)' held upon execution of processing by M bits toward a most significant side and 'a'(x) #(W−1)' including the (w−1)-th word, being used as factors.

With reference to b'(x) produced by the selection unit 114, the CRC calculation unit 115 divides a (d+M−1)-order polynomial with the respective bits of b'(x), being used as the factors, by the generated polynomial G(x), and remainder thus obtained is designated as C(x). In calculating C(x), bit shifting and exclusive-OR computation against the date as held are not executed.

The CRC calculation unit 115 delivers R(x) to the bits concatenating unit 112. Further, following the (w−1)-th word string, the computation controller 111 receives a bit string b(x) containing the final word valid data signal H(k) and the fraction bits block B(x) from the header analyzer 100-3 to deliver the bit string b(x) to the bits concatenating unit 112. Accordingly, the bits concatenating unit 112 is supplied with R(x) and the bit string b(x) containing the fraction bits block B(x).

Further, upon receiving the final word valid data signal H(k), the computation controller 111 delivers the data region select signal ABSEL indicative of "B(x) side" to the selection unit 114. Further, the computation controller 111 delivers the shift information p {p=M−H(k)} to the shifting unit 113.

The bits concatenating unit 112 concatenates the R(x) as the output {the CRC value of A(x)} of the CRC calculation unit 115 against the integral multiple bits block A(x) with the most significant bit side of the friction bits block B(x). R(x) has a length of d bits.

FIGS. 14A through 14C are a schematic illustration showing execution for concatenating R(x) with B(x). FIG. 14A shows the bit string b(x). The bit string b(x) contains the fraction bits block B(x) of H(k) bits in length. FIG. 14B shows the CRC calculation value R(x) of the integral multiple bits block A(x) shown in the w-th word strings in FIG. 13F. The bits concatenating unit 112 delivers, to the shifting unit 113, a data string (refer to FIG. 14C) of (d+M) bits in width which contains B"(x) {d+H(k) bits in length} as execution results of concatenating R(x) with B(x). It is sufficient for the bits concatenating unit 112 to concatenate R(x) with the most significant bits of the data string of (d+M) bits in width, containing B(x), thereby delivering the data string of M bits in width, containing B"(x), to the shifting unit 113.

Figure 15A:
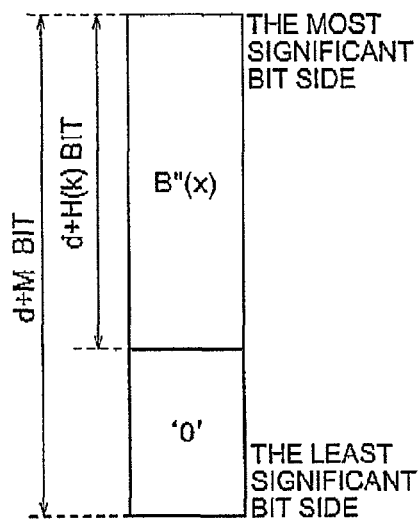
FIGS. 15A and 15B are a schematic illustration showing shift-processing by a shifting unit.
Figure 15B:
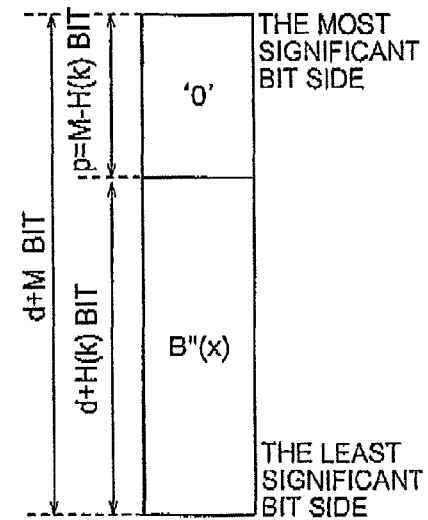

FIGS. 15A and 15B are a schematic illustration showing shift-processing by the shifting unit 113. In order to enable the CRC calculation unit 115 with (d+M) bits supplied thereto to execute the CRC calculation of the B"(x) contained in the output (refer to FIG. 15A) of the bits concatenating unit 112, the shifting unit 113 shifts the output data of the bits concatenating unit 112 by p bits toward the least significant bit in accordance with the shift information p {p=M−H(k)} from the computation controller 111. Further, the shifting unit 113 sets '0' unaffecting the CRC value to p bits on the most significant side, which data is lost due to shifting. A data string where there are executed the shift-processing and '0' setting to most significant p bits is denoted as b'(x). FIG. 15B shows the data string b'(x). The data string b'(x) has a bit length of (d+M) bits. The shifting unit 113 delivers the data string b'(x) to the selection unit 114.

Inasmuch as the computation controller 111 causes the data region select signal ABSEL to indicate "B(x) side" at this point in time, the selection unit 114 delivers, to the CRC calculation unit 115, the data string b'(x) supplied from the shifting unit 113 (refer to w column in FIG. 13E).

The shifting unit 113 according to the present second exemplary embedment is identical in configuration to the first shifting unit 13 according to the first exemplary embedment (refer to FIG. 7). Further, the shifting unit 113 is identical in operation to the first shifting unit 13 according to the first exemplary embedment.

When the data region select signal ABSEL indicates "B(x) side", the CRC calculation unit II 5 executes CRC calculation against the data string b'(x) {the data string containing B"(x) shifted by p bits toward the least significant bit} supplied from the selection unit 114, thereby producing a CRC value C(x) of B"(x). As previously described, the CRC calculation unit 115 divides the (d+M−1)-order polynomial with the respective bits of the b'(x), being used as the factors, by the generated polynomial G(x), thereby designating the remainder thereof as C(x).

The C(x) represents the inspection results of the CRC value. If the C(x) is "0", this will indicate that no error has occurred to a frame. If the C(x) is a value other than "0", this will indicate that an error has occurred to the frame.

The CRC calculation unit 115 delivers, to the frame disposal unit 100-5, the CRC error detection results C(x) against the input frame data, together with the input frame data of M bits in width, SOF, and H(k).

Now, effects of the present second exemplary embedment will be described hereinafter.

With the present second exemplary embedment, the bits concatenating unit 112 concatenates the CRC value of the integral multiple bits block with the fraction bit block, and the shifting unit 113 shifts the concatenated data by p {p=M−H(k)} bits toward the least significant bit side. Then, the CRC calculation unit 115 executes computation of the CRC value {C(x)} of the data after shifting, as the inspection results. By execution of the computation described as above, it is possible to work out the inspection results C(x) without execution of buffering in order to acquire a frame length.

Inasmuch as there is no need for buffering as described in the foregoing, it is possible to control delay in processing for finding the inspection results. If the present invention is applied to a communications technology, in regions of a server product and a high-performance computing product, with importance attached to delay characteristics thereof, this will enable an ultra-low delay CRC error detection.

Furthermore, inasmuch as there is no need for buffering, it is unnecessary to provide constituent elements for the purpose of the buffering, so that a circuit size can be reduced as with the case of the first exemplary embodiment.

With the configuration shown in FIG. 11, there is shown a case of the computation controller 111 generates the data region select signal ABSEL and the shift information p on the basis of the frame head signal SOF and the fraction bits signal H(k). Those signals and the information may be generated on the basis of signals other than SOF and H(k). The data region select signal ABSEL and the shift-information p may be generated on the basis of a bit-enable signal for every input of M bits.

In the description given in the foregoing, there is shown the case where the parallel CRC error detection unit 100-4 shown in FIG. 11 (the parallel cyclic code error detection device) works out the inspection results C(x) by shifting in units of bit, however, a shift amount in the shift-processing need not be in units of one bit. The computation controller 111 may generate the shift information p expressed in units of plural bits such as a byte, and so forth, and the shifting unit 113 may execute the shift-processing in units of the plural bits.

Further, the second exemplary embodiment described in the foregoing has been described by taking the case of the parallel CRC error detection unit 100-4 working out inspection results by use of the CRC code (CRC value) by way of example, however, the present invention is also applicable to the case of calculating inspection results by use of cyclic codes other than the CRC code, such as the hamming code, BCH code, and so forth, as a method for obtaining computation results without use of length of an input information string based on the formula (13) used in the present second exemplary embodiment. In such a case, it need only be sufficient to have means for calculating other cyclic codes (the hamming code, BCH code, and so forth) as a substitute for the CRC calculation unit 115 used for calculation of the CRC value. Even if a cyclic code other than the CRC value is computed, it is possible to gain the advantageous effect of dispensing with the buffering for finding the bit length of an input frame, so that occurrence of the delay and an increase in circuit size can be prevented, thereby easing constraints imposed on a broader band.

The constituent elements (the computation controller 111, the bits concatenating unit 112, the shifting unit 113, the selection unit 114, the CRC calculation unit 115) of the parallel CRC error detection unit 100-4 (the parallel cyclic code error detection device) each may be an individual circuit. Otherwise, the respective constituent elements of the parallel CRC error detection unit 100-4 may be implemented by a CPU to be operated in accordance with a program (a parallel cyclic code error detection program). For example, the CPU may be enabled to read the parallel cyclic code error detection program, pre-stored in a memory, to be thereby operated as the computation controller 111, the bits concatenating unit 112, the shifting unit 113, the selection unit 114, and the CRC calculation unit 115, respectively, in accordance with the parallel cyclic code error detection program.

The parallel CRC error detection unit of a configuration shown in FIG. 11 can be used as an inspection circuit of cyclic codes in a system for receiving frames transmitted from the network interface card (the network interface card to which the present invention is applied), shown in FIG. 1. Similarly, the parallel CRC processing unit of a configuration shown in FIG. 2 can be used as a cyclic code generation circuit in a system for transmitting frames to a line card (a line card to which the present invention is applied) shown in FIG. 10.

In the description given in the foregoing, there have been shown the network interface card and the line card (with the present invention applied thereto) by way of example, however, the present invention may be applied to systems other than the network interface card and the line card.

Figure 16:
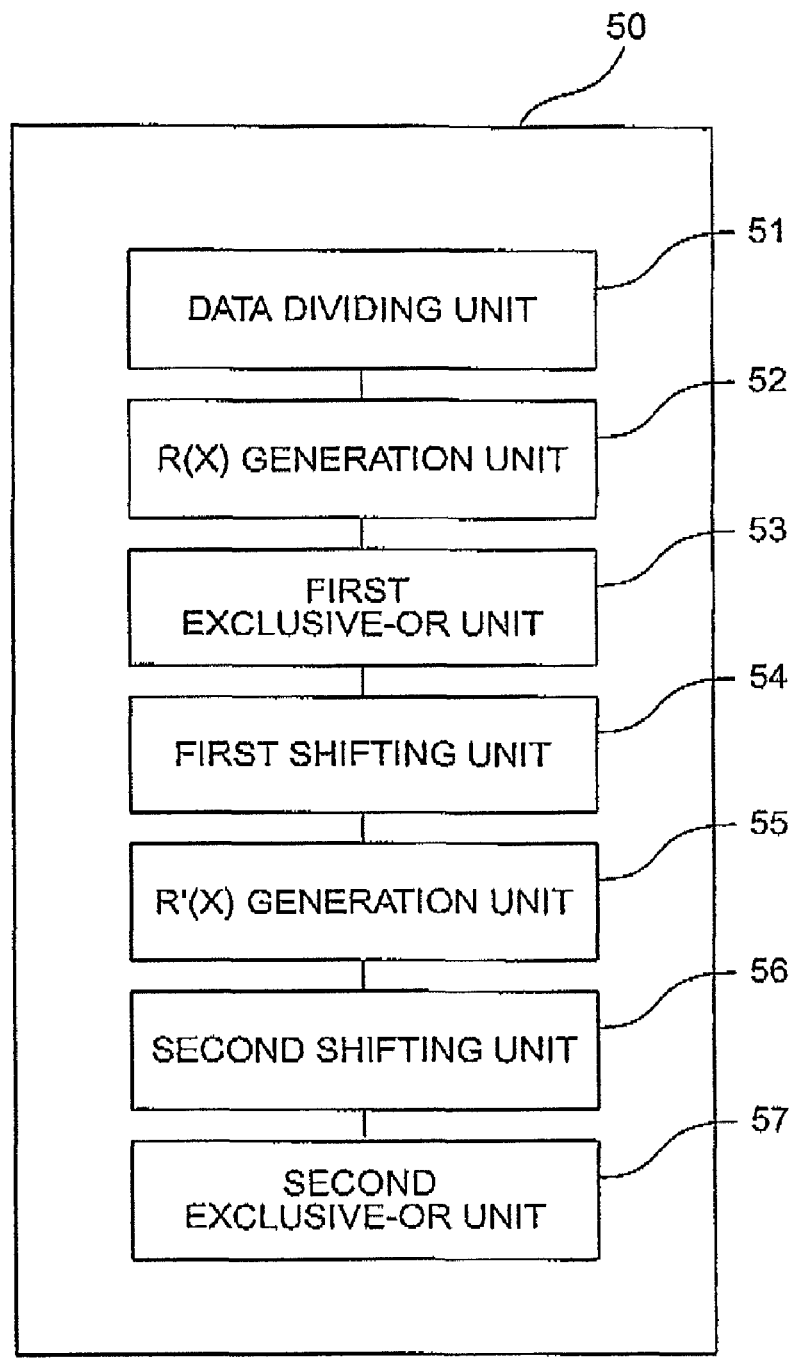
FIG. 16 is a block diagram showing the overview of the cyclic code generation device according to the present invention.

Next, an overview of the present invention will be described hereinafter. FIG. 16 is a block diagram showing the overview of the cyclic code generation device according to the present invention. The cyclic code generation device 50 according to the invention comprises a data dividing unit 51, an R(x) generation unit 52, a first exclusive-OR unit 53, a first shifting unit 54, an R'(x) generation unit 55, a second shifting unit 56, and a second exclusive-OR unit 57.

The data dividing unit 51 parallel-produces bit strings contained in data as an object of cyclic code generation, such as a frame and so forth, so as to be M bits in width, respectively, thereby dividing the data as the object of the cyclic code generation into an integral multiple bits block A(x) and a fraction bits block B(x). The integral multiple bits block A(x) is a data block of the object of the cyclic code generation, with a length corresponding to an integral multiple of M bits from the header of the data as the object of the cyclic code generation. The fraction bits block B(x) is a data block of the object of the cyclic code generation, less than M bits, excluding the integral multiple bits block A(x).

The R(x) generation unit 62 generates a cyclic code R(x) as the cyclic code of the integral multiple bits block A(x). The first exclusive-OR unit 53 executes computation of exclusive-OR of the cyclic code R(x) and a data string of M bits, containing the fraction bits block B(x). The first shifting unit 54 shifts the exclusive-OR of the cyclic code R(x) and the data string of M bits, containing the fraction bits block B(x), by {M−H(k)} bits toward a least significant side and sets 0 to {M−H(k)} bits on a most significant side. Herein, H(k) is a value indicative of a bit length of the fraction bits block B(x).

The R'(x) generation unit 55 generates a cyclic code R'(x) that is a cyclic code of the data subjected to shifting and setting to 0, by the first shifting unit 54. The second shifting unit 56 shifts the cyclic code R(x) by H(k) bits toward a most significant side, thereby generating data R"(x) that is data obtained by setting 0 to H(k) bits on a least significant side. The second exclusive-OR unit 57 executes computation of exclusive-OR of the cyclic code R'(x) and the data R"(x).

The exclusive-OR as computed by the second exclusive-OR unit 57 is a cyclic code of the data as the object of the cyclic code generation. If the cyclic code is generated in this way, there will be no need for calculating a bit length of the data as the object of the cyclic code generation, so that it is possible to eliminate the need for buffering processing to calculate the bit length of the data as the object of the cyclic code generation.

The data dividing unit 51 shown in FIG. 16 can be implemented by, for example, the computation controller 11 shown in FIG. 2. The A(x) generation unit 62 and the R'(x) generation unit 55 can be implemented by, for example, the CRC calculation unit 15, respectively. The first exclusive-OR unit 53 can be implemented by, for example, the first exclusive-OR unit 12. The first shifting unit 54 can be implemented by, for example, the first shifting unit 13. The second shifting unit 56 can be implemented by, for example, the second shifting unit 16. The second exclusive-OR unit 57 can be implemented by, for example, the second exclusive-OR unit 17.

Further, with the first exemplary embodiment, there is disclosed a configuration wherein the R(x) generation unit and the R'(x) generation unit are implemented by a single circuit and provided with a selection unit. The selection unit sends the integral multiple bits block A(x) to the circuit generating R(x) and the R'(x) when the data dividing unit produces the integral multiple bits block A(x). When the first shifting unit executes shifting and 0 setting against the exclusive-OR of the cyclic code R(x) and the data string of M bits, containing the fraction bits block B(x), the selection unit sends the data subjected to the shifting and 0 setting to the circuit generating R(x) and the R'(x).

Further, it is disclosed that the R(x) generation unit generates a cyclic code R(x) by repeating the steps of calculating the remainder obtained by dividing, by a d-order generation polynomial, an (M−1)-order polynomial with respective bits of a first bit string of M bits, contained in the integral multiple bits block A(x), being used as a factor, of holding the remainder, of calculating exclusive-OR of a bit string of M bits in width and data obtained by shifting held data by (M−d) bits toward a most significant side, for every bit string of every subsequent M bits, of calculating the remainder obtained by dividing, by the generation polynomial, an (M−1)-order polynomial with respective bits of the exclusive-OR, being used as a factor, and of holding the remainder.

It is also disclosed that the R'(x) generation unit generates R'(x) by calculating the remainder obtained by dividing, by a generation polynomial, an (M−1)-order polynomial with respective bits of the data subjected to shifting and setting to 0 by the first shifting unit, being used as factors.

Figure 17:
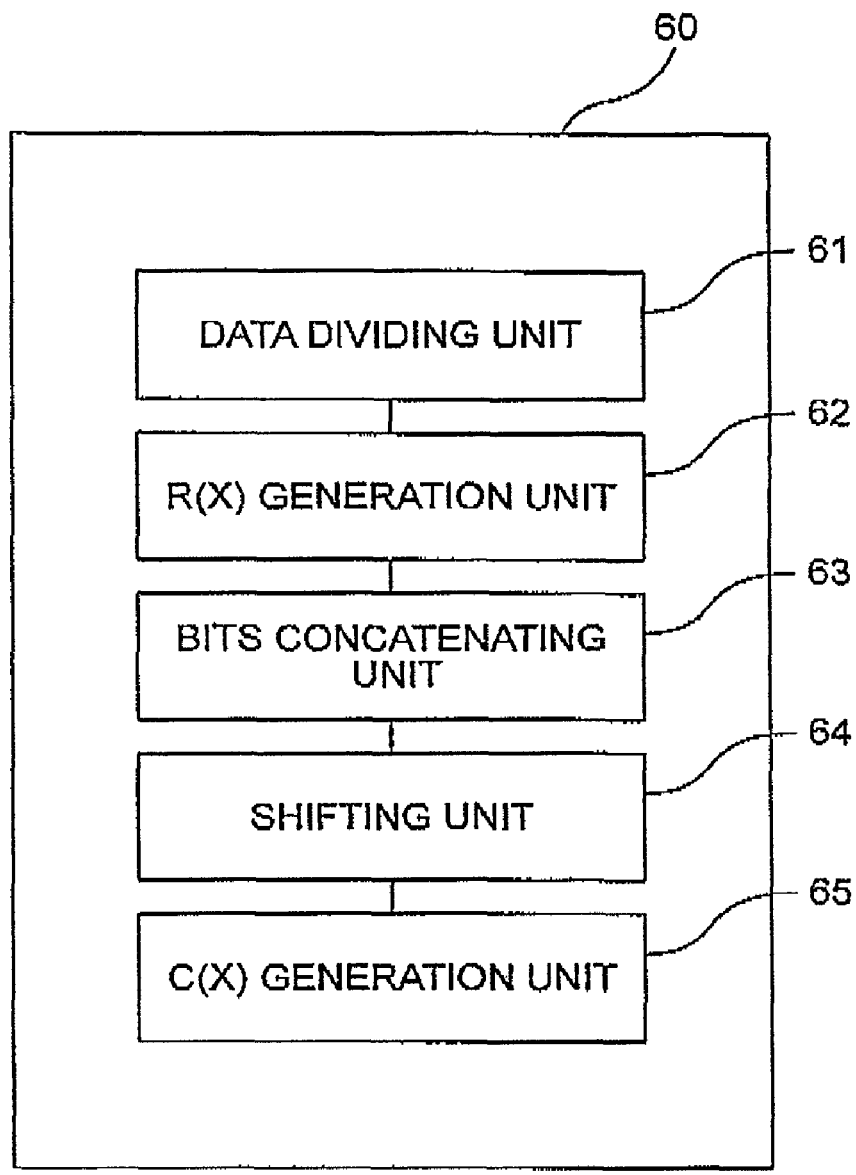
FIG. 17 is a block diagram showing the overview of the cyclic code error detection device according to the present invention.

FIG. 17 is a block diagram showing the overview of the cyclic code error detection device according to the present invention. The cyclic code error detection device 60 according to the present invention comprises a data dividing unit 61, an R(x) generation unit 62, a bits concatenating unit 63, a shifting unit 64, and a C(x) generation unit 65.

The data dividing unit 61 produces bit strings in parallel, contained in data as an object of inspection, such as a frame and so forth, so as to be M bits in width, respectively, thereby dividing the data as the object of the inspection into an integral multiple bits block A(x) and a fraction bits block B(x). The integral multiple bits block A(x) is a data block of the object of the inspection, with a length corresponding to an integral multiple of M bits from the header of the data as the object of the inspection. The fraction bits block B(x) is a data block of the object of the inspection, less than M bits, excluding the integral multiple bits block A(x).

The R(x) generation unit 62 generates a cyclic code R(x) as the cyclic code of the integral multiple bits block A(x). The bits concatenating unit 63 executes concatenating the cyclic code R(x) with a data string of M bits, containing the fraction bits block B(x). The shifting unit 64 shifts the data concatenated the cyclic code R(x) with the data string of M bits, containing the fraction bits block B(x), by {M−H(k)} bits toward a least significant side, and sets to {M−H(k)} bits on a most significant side. Herein, H(k) is a value indicative of a bit length of the fraction bits block B(x). The C(x) generation unit 65 generates a cyclic code C(x) that is a cyclic code of the data subjected to shifting and setting to 0, by the shifting unit 64.

The C(x) represents inspection results for checking an error in data. If C(x)=0, this indicates no error. If the C(x) is a value other than 0, this indicates that an error has occurred. If the inspection results C(x) is worked out in this way, there will be no need for calculating a bit length of data as the object of the inspection, so that it is possible to eliminate the need for executing buffering to calculate the bit length.

Further, the data dividing unit 61 shown in FIG. 17 can be implemented by, for example, the computation controller 111 shown in FIG. 11. The R(x) generation unit 62 and the C(x) generation unit 65 can be implemented by, for example, the CRC calculation unit 115. The bits concatenating unit 63 can be implemented by, for example, the bits concatenating unit 112. The shifting unit 64 can be implemented by, for example, the shifting unit 113.

Further, with the second exemplary embodiment, there is disclosed a configuration wherein the R(x) generation unit and the C(x) generation unit are implemented by a single circuit and provided with a selection unit. The selection unit sends the data concatenated the 0 data d bits long with the most significant bit side of each word of the integral multiple bits block A(x) to the circuit generating R(x) and C(x) when the data dividing unit produces the integral multiple bits block A(x). When the shifting unit executes shifting and 0 setting against the data concatenated the cyclic code R(x) with the data string of M bits, containing the fraction bits block B(x), the selection unit sends the data subjected to the shifting and 0 setting to the circuit generating R(x) and C(x).

Still further, it is disclosed that the R(x) generation unit generates a cyclic code R(x) by repeating the steps of calculating the remainder obtained by dividing, by a d-order generation polynomial, a (d+M−1)-order polynomial with respective bits of a first bit string of (d+M) bits, contained in the integral multiple bits block A(x), being used as a factor, of holding the remainder, of calculating exclusive-OR of a bit string of (d+M) bits in width and data obtained by shifting data as held by M bits toward a most significant side, for every bit string of every subsequent (d+M) bits, of calculating the remainder obtained by dividing, by the generation polynomial, a (d+M−1)-order polynomial with respective bits of the exclusive-OR, being used as factors, and of holding the remainder.

It is also disclosed that the C(x) generation unit generates C(x) by calculating the remainder obtained by dividing, by a generation polynomial, a (d+M−1)-order polynomial with respective bits of the data subjected to shifting and setting to 0 by the first shifting unit, being used as factors.

Further, the integral multiple bits block A(x) shown in the respective exemplary embodiments of the invention corresponds to an integral multiple data block A(x), and the fraction bits block B(x) shown in the respective exemplary embodiments of the invention corresponds to a fraction data block B(x).

A parallel cyclic code generation method according to a third exemplary embodiment of the invention is a parallel cyclic code generation method for generating cyclic codes by dividing data as an object of cyclic code generation, optional in bit length, by a generation polynomial, for every M bits. The method includes causing a data dividing unit to produce a bit string contained in data as the object of the cyclic code generation, for every M bits, thereby dividing the data as the object of the cyclic code generation into an integral multiple bits block A(x) that is a data block of the object of the cyclic code generation, with a length corresponding to an integral multiple of M bits from the header of the data as the object of the cyclic code generation, and a fraction bits block B(x) that is a data block of the object of the cyclic code generation, less than M bits, excluding the integral multiple bits block A(x), causing an R(x) generation unit to generate a cyclic code R(x) as the cyclic code of the integral multiple bits block A(x), causing a first exclusive-OR unit to execute computation of exclusive-OR of the cyclic code R(x) and a data string of M bits, containing the fraction bits block B(x), causing a first shifting unit to shift the exclusive-OR of the cyclic code R(x) and the data string of M bits, containing the fraction bits block B(x), by {M−H(k)} bits toward a least significant side in the case of a bit length of the fraction bits block R(x) being H(k) bits, thereby the first shifting unit setting 0 to {M−H(k)} bits on a most significant side, causing an R'(x) generation unit to generate a cyclic code R'(x) that is a cyclic code of the data subjected to shifting and setting to 0, by the first shifting unit, causing a second shifting unit to shift the cyclic code R(x) by H(k) bits toward a most significant side, thereby generating data R"(x) that is data obtained by setting 0 to H(k) bits on a least significant side, and causing a second exclusive-OR unit to execute computation of exclusive-OR of the cyclic code R'(x) and the data R"(x).

A parallel cyclic code error detection method according to a fourth exemplary embodiment of the invention is a parallel cyclic code error detection method for inspecting an error in data by executing division against data containing cyclic codes, as an object of inspection, optional in bit length, by a generation polynomial, for every M bits. The method includes causing a data dividing unit to produce a bit string contained in data as the object of the inspection, for every M bits, thereby dividing the data as the object of the inspection into an integral multiple bits block A(x) that is a data block of the object of the inspection, with a length corresponding to an integral multiple of M bits from the header of the data as the object of the inspection, and a fraction bits block B(x) that is a data block of the object of the inspection, less than M bits, excluding the integral multiple bits block A(x), causing an R(x) generation unit to generate a cyclic code R(x) as the cyclic code of the integral multiple bits block A(x), causing a bit concatenating unit to execute concatenating the cyclic code R(x) with a data string of M bits, containing the fraction bits block B(x), causing a shifting unit to shift the data concatenated the cyclic code R(x) with the data string of M bits, containing the fraction bits block B(x), by {M−H(k)} bits toward a least significant side in the case of a bit length of the fraction bits block B(x) being H(k) bits, thereby the shifting unit setting 0 to {M−H(k)} bits on a most significant side, and causing a C(x) generation unit to generate a cyclic code C(x) that is a cyclic code of the data subjected to shifting and setting to 0, by the shifting unit.

A recording medium according to a fifth exemplary embodiment of the invention records a parallel cyclic code generation program mounted in a computer for executing division against data as an object of cyclic code generation, optional in bit length, by a generation polynomial, for every M bits, thereby generating cyclic codes. The parallel cyclic code generation program causes the computer to execute an operation which includes data dividing processing for producing a bit string contained in data as the object of the cyclic code generation, for every M bits, thereby dividing the data as the object of the cyclic code generation into an integral multiple bits block A(x) that is a data block of the object of the cyclic code generation, with a length corresponding to an integral multiple of M bits from the header of the data as the object of the cyclic code generation, and a fraction bits block B(x) that is a data block of the object of the cyclic code generation, less than M bits, excluding the integral multiple bits block A(x), R(x) generation processing for generating a cyclic code R(x) as the cyclic code of the integral multiple bits block A(x), first exclusive-OR processing for executing computation of exclusive-OR of the cyclic code R(x) and a data string of M bits, containing the fraction bits block B(x), first shifting processing for shifting the exclusive-OR of the cyclic code R(x) and the data string of M bits, containing the fraction bits block B(x), by {M−H(k)} bits toward a least significant side in the case of a bit length of the fraction bits block B(x) being H(k) bits, thereby the first shifting processing setting 0 to {M−H(k)} bits on a most significant side, R'(x) generation processing for generating a cyclic code R'(x) that is a cyclic code of the data subjected to shifting and setting to 0, by the first shifting processing, second shifting processing for shifting the cyclic code R(x) by H(k) bits toward a most significant side, thereby generating data R"(x) that is data obtained by setting 0 to H(k) bits on a least significant side, and second exclusive-OR processing for executing computation of exclusive-OR of the cyclic code R'(x) and the data R"(x).

A recording medium according to a sixth exemplary embodiment of the invention records a parallel cyclic code error detection program mounted in a computer for inspecting an error in data by executing division against data containing cyclic codes, as an object of inspection, optional in bit length, by a generation polynomial, for every M bits. The parallel cyclic code error detection program causes the computer to execute an operation which includes data dividing processing to produce a bit string contained in data as the object of the inspection, for every M bits, thereby dividing the data as the object of the inspection into an integral multiple bits block A(x) that is a data block of the object of the inspection, with a length corresponding to an integral multiple of M bits from the header of the data as the object of the inspection, and a fraction bits block B(x) that is a data block of the object of the inspection, less than M bits, excluding the integral multiple bits block A(x), R(x) generation processing to generate a cyclic code R(x) as the cyclic code of the integral multiple bits block A(x), bits concatenating processing to execute concatenating the cyclic code R(x) with a data string of M bits, containing the fraction bits block B(x), shifting processing to shift the data concatenated the cyclic code R(x) with the data string of M bits, containing the fraction bits block B(x), by {M−H(k)} bits toward a least significant side in the case of a bit length of the fraction bits block B(x) being H(k) bits, thereby the shifting processing setting 0 to {M−H(k)} bits on a most significant side, and C(x) generation processing to generate a cyclic code C(x) that is a cyclic code of the data subjected to shifting and setting to 0, by the shifting processing.

An exemplary advantage according to the invention is that computation of a cyclic code can be executed without use of the data length information, so that it is possible to eliminate the need for buffering in order to calculate the data length. Furthermore, as a result of this, it is possible to prevent processing delay, and an increase in circuit size, due to the buffering to calculate the data length information, and to ease constraints on broader bandwidths.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The present invention is suitably applicable to respective industrial fields such as a digital communications technological field, and so forth, for generation, and inspection of a cyclic code used as a code for detection of an error in digital data.

What is claimed is:

1. A parallel cyclic code generation device for executing division against data as an object of cyclic code generation, optional in bit length, by a generation polynomial, for every M bits, thereby generating cyclic codes, the device comprising:
   a data dividing unit for parallel-producing bit strings contained in data as the object of the cyclic code generation, so as to be M bits in width, respectively, thereby dividing the data as the object of the cyclic code generation into an integral multiple bits block A(x) and a fraction bits block B(x), the integral multiple bits block A(x) being a data block of the object of the cyclic code generation, with a length corresponding to an integral multiple of M bits from the header of the data as the object of the cyclic code generation, the fraction bits block B(x) being a data block of the object of the cyclic code generation, less than M bits, excluding the integral multiple bits block A(x);
   an R(x) generation unit for generating a cyclic code R(x) as the cyclic code of the integral multiple bits block A(x);
   a first exclusive-OR unit for executing computation of exclusive-OR of the cyclic code R(x) and a data string of M bits, containing the fraction bits block B(x);
   a first shifting unit for shifting the exclusive-OR of the cyclic code R(x) and the data string of M bits, containing the fraction bits block B(x), by {M−H(k)} bits toward a least significant side in the case of a bit length of the fraction bits block B(x) being H(k) bits, said first shifting unit setting 0 to {M−H(k)} bits on a most significant side;
   an R'(x) generation unit for generating a cyclic code R'(x) that is a cyclic code of the data subjected to shifting and setting to 0, by the first shifting unit;
   a second shifting unit for shifting the cyclic code R(x) by H(k) bits toward a most significant side, thereby generating data R"(x) that is data obtained by setting 0 to H(k) bits on a least significant side; and
   a second exclusive-OR unit for executing computation of exclusive-OR of the cyclic code R'(x) and the data R"(x).

2. The parallel cyclic code generation device according to claim 1, wherein the R(x) generation unit and the R'(x) generation unit are implemented by a single circuit, said parallel cyclic code generation device further comprising a selection unit for sending the integral multiple bits block A(x) to the circuit when the data dividing unit produces the integral multiple bits block A(x), when the first shifting unit executes shifting and 0 setting against the exclusive-OR of the cyclic code R(x) and the data string of M bits, containing the fraction bits block B(x), the selection unit sending, to the circuit, the data subjected to the shifting and 0 setting.

3. The parallel cyclic code generation device according to claim 1, wherein the R(x) generation unit generates the cyclic code R(x) by repeating the steps of:
   calculating the remainder obtained by dividing, by a d-order generation polynomial, an (M−1)-order polynomial with respective bits of a first bit string of M bits, contained in the integral multiple bits block A(x), being used as a factor;
   holding the remainder;
   calculating exclusive-OR of a bit string of M bits in width and data obtained by shifting data as held by (M−d) bits toward a most significant side, for every bit string of every subsequent M bits;
   calculating the remainder obtained by dividing, by the generation polynomial, an (M−1)-order polynomial with respective bits of the exclusive-OR, being used as a factor; and
   holding the remainder.

4. The parallel cyclic code generation device according to claim 1, wherein the R'(x) generation unit generates the cyclic code R'(x) by calculating the remainder obtained by dividing, by a generation polynomial, an (M−1)-order polynomial with respective bits of the data subjected to shifting and setting to 0 by the first shifting unit, being used as a factor.

5. The parallel cyclic code generation device according to claim 1, wherein a cyclic code represents a CRC value.

6. A parallel cyclic code error detection device for executing division against data containing cyclic codes, as an object of inspection, optional in bit length, by a generation polynomial, for every M bits, thereby inspecting an error in data, the device comprising:
   a data dividing unit for parallel-producing bit strings contained in data as the object of the inspection, so as to be M bits in width, respectively, thereby dividing the data as the object of the inspection into an integral multiple bits block A(x) and a fraction bits block B(x), the integral multiple bits block A(x) being a data block of the object of the inspection, with a length corresponding to an integral multiple of M bits from the header of the data as the object of the inspection, the fraction bits block B(x) being a data block of the object of the inspection, less than M bits, excluding the integral multiple bits block A(x),
   an R(x) generation unit for generating a cyclic code R(x) as the cyclic code of the integral multiple bits block A(x);
   a bits concatenating unit for concatenating the cyclic code R(x) with a data string of M bits, containing the fraction bits block B(x);
   a shifting unit for shifting the data concatenated the cyclic code R(x) with the data string of M bits, containing the fraction bits block B(x), and by {M−H(k)} bits toward a least significant side in the case of a bit length of the fraction bits block B(x) being H(k) bits, the shifting unit setting 0 to {M−H(k)} bits on a most significant side; and
   a C(x) generation unit for generating a cyclic code C(x) that is a cyclic code of the data subjected to shifting and setting to 0, by the shifting unit.

7. The parallel cyclic code error detection device according to claim 6, wherein the R(x) generation unit and the R'(x) generation unit are implemented by a single circuit, the parallel cyclic code error detection device further comprising a selection unit for sending the data concatenated the 0 data of d bits long with the most significant bit side of each word of the integral multiple bits block A(x) to the circuit when the data dividing unit produces the integral multiple bits block A(x), when the first shifting unit executes shifting and 0 setting against the data concatenated the cyclic code R(x) with the data string of M bits, containing the fraction bits block B(x), the selection unit sending the data subjected to the shifting and 0 setting to the circuit.

8. The parallel cyclic code error detection device according to claim 6, wherein the R(x) generation unit generates the cyclic code R(x) by repeating the steps of:
- calculating the remainder obtained by dividing, by a d-order generation polynomial, a (d+M−1)-order polynomial with respective bits of a first bit string of (d+M) bits, contained in the integral multiple bits block A(x), being used as a factor;
- holding the remainder;
- calculating exclusive-OR of a bit string of (d+M) bits in width and data obtained by shifting data as held by M bits toward a most significant side, for every bit string of every subsequent (d+M) bits;
- calculating the remainder obtained by dividing, by the generation polynomial, a (d+M−1)-order polynomial with respective bits of the exclusive-OR, being used as factors; and
- holding the remainder.

9. The parallel cyclic code error detection device according to claim 6, wherein the C(x) generation unit generates the cyclic code C(x) by calculating the remainder obtained by dividing, by a generation polynomial, a (d+M−1)-order polynomial with respective bits of the data subjected to shifting and setting to 0 by the first shifting unit, being used as factors.

10. The parallel cyclic code error detection device according to claim 6, wherein the cyclic code represents a CRC value.

11. A parallel cyclic code generation method for generating cyclic codes by dividing data as an object of cyclic code generation, optional in bit length, by a generation polynomial, for every M bits, the method comprising:
- causing a data dividing unit to produce a bit string contained in data as the object of the cyclic code generation, for every M bits, thereby dividing the data as the object of the cyclic code generation into an integral multiple bits block A(x) and a fraction bits block B(x), the integral multiple bits block A(x) being a data block of the object of the cyclic code generation, with a length corresponding to an integral multiple of M bits from the header of the data as the object of the cyclic code generation, the fraction bits block B(x) being a data block of the object of the cyclic code generation, less than M bits, excluding the integral multiple bits block A(x);
- causing an R(x) generation unit to generate a cyclic code R(x) as the cyclic code of the integral multiple bits block A(x);
- causing a first exclusive-OR unit to execute computation of exclusive-OR of the cyclic code R(x) and a data string of M bits, containing the fraction bits block B(x);
- causing a first shifting unit to shift the exclusive-OR of the cyclic code R(x) and the data string of M bits, containing the fraction bits block B(x), by {M−H(k)} bits toward a least significant side in the case of a bit length of the fraction bits block B(x) being H(k) bits, thereby the first shifting unit setting 0 to {M−H(k)} bits on a most significant side;
- causing an R'(x) generation unit to generate a cyclic code R'(x) that is a cyclic code of the data subjected to shifting and setting to 0, by the first shifting unit;
- causing a second shifting unit to shift the cyclic code R(x) by H(k) bits toward a most significant side, thereby generating data R"(x) that is data obtained by setting 0 to H(k) bits on a least significant side; and
- causing a second exclusive-OR unit to execute computation of exclusive-OR of the cyclic code R'(x) and the data R"(x).

12. A parallel cyclic code error detection method for inspecting an error in data by executing division against data containing cyclic codes, as an object of inspection, optional in bit length, by a generation polynomial, for every M bits, the method comprising:
- causing a data dividing unit to produce a bit string contained in data as the object of the inspection, for every M bits, thereby dividing the data as the object of the inspection into an integral multiple bits block A(x) and a fraction bits block B(x), the integral multiple bits block A(x) being a data block of the object of the inspection, with a length corresponding to an integral multiple of M bits from the header of the data as the object of the inspection, the fraction bits block B(x) being a data block of the object of the inspection, less than M bits, excluding the integral multiple bits block A(x);
- causing an R(x) generation unit to generate a cyclic code R(x) as the cyclic code of the integral multiple bits block A(x);
- causing a bits concatenating unit to execute concatenating the cyclic code R(x) with a data string of M bits, containing the fraction bits block B(x);
- causing a shifting unit to shift the data concatenated the cyclic code R(x) with the data string of M bits, containing the fraction bits block B(x), by {M−H(k)} bits toward a least significant side in the case of a bit length of the fraction bits block B(x) being H(k) bits, thereby the shifting unit setting 0 to {M−H(k)} bits on a most significant side; and
- causing a C(x) generation unit to generate a cyclic code C(x) that is a cyclic code of the data subjected to shifting and setting to 0, by the shifting unit.

13. A recording medium for recording a parallel cyclic code generation program mounted in a computer for executing division against data as an object of cyclic code generation, optional in bit length, by a generation polynomial, for every M bits, thereby generating cyclic codes, the program causing the computer to execute an operation comprising:
- data dividing processing for producing a bit string contained in data as the object of the cyclic code generation, for every M bits, thereby dividing the data as the object of the cyclic code generation into an integral multiple bits block A(x) and a fraction bits block B(x), the integral multiple bits block A(x) being a data block of the object of the cyclic code generation, with a length corresponding to an integral multiple of M bits from the header of the data as the object of the cyclic code generation, the fraction bits block B(x) being a data block of the object of the cyclic code generation, less than M bits, excluding the integral multiple bits block A(x);
- R(x) generation processing for generating a cyclic code R(x) as the cyclic code of the integral multiple bits block A(x);
- first exclusive-OR processing for executing computation of exclusive-OR of the cyclic code R(x) and a data string of M bits, containing the fraction bits block B(x);
- first shifting processing for shifting the exclusive-OR of the cyclic code R(x) and the data string of M bits, containing the fraction bits block B(x), by {M−H(k)} bits toward a least significant side in the case of a bit length of the fraction bits block B(x) being H(k) bits, thereby the first shifting processing setting 0 to {M−H(k)} bits on a most significant side;

R'(x) generation processing for generating a cyclic code R'(x) that is a cyclic code of the data subjected to shifting and setting to 0, by the first shifting processing;

second shift processing for shifting the cyclic code R(x) by H(k) bits toward a most significant side, thereby generating data R"(x) that is data obtained by setting 0 to H(k) bits on a least significant side; and second exclusive-OR processing for executing computation of exclusive-OR of the cyclic code R'(x) and the data R"(x).

14. A recording medium for recording a parallel cyclic code error detection program mounted in a computer for inspecting an error in data by executing division against data containing cyclic codes, as an object of inspection, optional in bit length, by a generation polynomial, for every M bits, the program causing the computer to execute an operation comprising:

data dividing processing to produce a bit string contained in data as the object of the inspection, for every M bits, thereby dividing the data as the object of the inspection into an integral multiple bits block A(x) and a fraction bits block B(x), the integral multiple bits block A(x) being a data block of the object of the inspection, with a length corresponding to an integral multiple of M bits from the header of the data as the object of the inspection, the fraction bits block B(x) being a data block of the object of the inspection, less than M bits, excluding the integral multiple bits block A(x);

R(x) generation processing to generate a cyclic code R(x) as the cyclic code of the integral multiple bits block A(x);

bits concatenating processing to execute concatenating the cyclic code R(x) with a data string of M bits, containing the fraction bits block B(x);

shifting processing to shift the data concatenated the cyclic code R(x) with the data string of M bits, containing the fraction bits block B(x), by {M−H(k)} bits toward a least significant side in the case of a bit length of the fraction bits block B(x) being H(k) bits, thereby the shifting processing setting 0 to {M−H(k)} bits on a most significant side; and C(x) generation processing to generate a cyclic code of the data subjected to shifting and setting to 0, by the shifting processing.

\* \* \* \* \*

UNITED STATES PATENT AND TRADEMARK OFFICE
CERTIFICATE OF CORRECTION

PATENT NO.       : 7,870,466 B2
APPLICATION NO.  : 12/198389
DATED            : January 11, 2011
INVENTOR(S)      : Masahiro Shigihara and Toru Takamichi It is certified that error appears in the above-identified patent and that said Letters Patent is hereby corrected as shown below:

Column 12, Line 5: delete "5A)" and insert -- 3A) --

Column 28, Line 55: delete "II 5" and insert -- 115 --

Column 31, Line 9: delete "A(x)" and insert -- R(x) --

Column 31, Line 9: delete "62" and insert -- 52 --

Column 32, Line 5: before "to" insert -- 0 --

Column 33, Line 20: delete "R(x)" and insert -- B(x) --

Signed and Sealed this
Sixteenth Day of October, 2012

David J. Kappos
*Director of the United States Patent and Trademark Office*